(12) United States Patent
Shin et al.

(10) Patent No.: US 12,364,097 B2
(45) Date of Patent: Jul. 15, 2025

(54) ELECTRONIC DEVICE COMPRISING OPTICAL SENSOR AND ENCAPSULATION LAYERS

(71) Applicant: Samsung Electronics Co., Ltd., Suwon-si (KR)

(72) Inventors: Sungyoung Shin, Suwon-si (KR); Minsuk Uhm, Suwon-si (KR); Hyunchang Shin, Suwon-si (KR); Byungduk Yang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 147 days.

(21) Appl. No.: 17/968,314

(22) Filed: Oct. 18, 2022

(65) Prior Publication Data
US 2023/0038568 A1 Feb. 9, 2023

Related U.S. Application Data

(63) Continuation of application No. PCT/KR2021/004975, filed on Apr. 21, 2021.

(30) Foreign Application Priority Data

Apr. 21, 2020 (KR) .................. 10-2020-0048178

(51) Int. Cl.
*H10K 50/844* (2023.01)
*G02F 1/1333* (2006.01)
(Continued)

(52) U.S. Cl.
CPC ......... *H10K 50/8445* (2023.02); *H10K 59/60* (2023.02); *G02F 1/13338* (2013.01); *G02F 1/1339* (2013.01)

(58) Field of Classification Search
CPC .................. G02F 1/13338; G02F 1/1339
See application file for complete search history.

(56) References Cited

U.S. PATENT DOCUMENTS 6,949,389 B2  9/2005  Pichler et al.
9,287,335 B2  3/2016  Yi
(Continued)

FOREIGN PATENT DOCUMENTS

CN       107731888 A    2/2018
KR   10-2011-0101774 A  9/2011
(Continued)

OTHER PUBLICATIONS

European Search Report dated Sep. 21, 2023; European Appln. No. 21792122.0-1224 / 4141529 PCT/KR2021004975.
(Continued)

*Primary Examiner* — Lauren Nguyen
(74) *Attorney, Agent, or Firm* — Jefferson IP Law, LLP

(57) ABSTRACT

An electronic device is provided. The electronic device includes a display panel and at least one optical sensor. The display panel is disposed in an internal space of a housing so as to be visible from the outside and includes a display region and a sensor region. The at least one optical sensor may correspond, below the display panel, to the sensor region. The display panel includes a plurality of pixels disposed on a substrate, a plurality of driving circuit units for driving the plurality of pixels, a first encapsulation unit for encapsulating the sensor region, and a second encapsulation unit for encapsulating the display region. The first encapsulation unit and the second encapsulation unit may be different in terms of the stacked structure of layers.

9 Claims, 21 Drawing Sheets

(51) Int. Cl.
*G02F 1/1339* (2006.01)
*H10K 59/60* (2023.01)

(56) References Cited

U.S. PATENT DOCUMENTS

| | | | |
|---|---|---|---|
| 9,728,594 | B2 | 8/2017 | Choi et al. |
| 9,997,738 | B2 | 6/2018 | Choi et al. |
| 10,374,019 | B2 | 8/2019 | Yoo et al. |
| 10,991,774 | B2 | 4/2021 | Sung et al. |
| 11,048,306 | B2 | 6/2021 | Kwak et al. |
| 11,140,791 | B2 | 10/2021 | Her et al. |
| 11,211,584 | B2 | 12/2021 | Lee et al. |
| 2011/0223697 | A1 | 9/2011 | Yong-Hwan et al. |
| 2017/0221976 | A1* | 8/2017 | Park .................... H10K 50/844 |
| 2018/0090722 | A1 | 3/2018 | Kim et al. |
| 2019/0051859 | A1 | 2/2019 | Choi et al. |
| 2019/0074481 | A1 | 3/2019 | Kim et al. |
| 2019/0081273 | A1 | 3/2019 | Sung et al. |
| 2019/0115415 | A1 | 4/2019 | Choi et al. |
| 2019/0245160 | A1 | 8/2019 | Yoon et al. |
| 2019/0279580 | A1 | 9/2019 | Noh et al. |
| 2020/0287161 | A1* | 9/2020 | Kim .................... H10K 50/15 |
| 2021/0083227 | A1 | 3/2021 | Hier et al. |

FOREIGN PATENT DOCUMENTS

| | | | | |
|---|---|---|---|---|
| KR | 10-2017-0024182 | A | 3/2017 | |
| KR | 10-2017-0055612 | A | 5/2017 | |
| KR | 10-2019-0041553 | A | 4/2019 | |
| KR | 10-2019-0084397 | A | 7/2019 | |
| KR | 10-2019-0089578 | A | 7/2019 | |
| KR | 10-2019-0098703 | A | 8/2019 | |
| KR | 10-2019-0132602 | A | 11/2019 | |
| KR | 10-2020-0026381 | A | 3/2020 | |
| KR | 10-2020-0039422 | A | 4/2020 | |
| KR | 10-2407869 | B1 | 6/2022 | |
| WO | 2012/089847 | A2 | 7/2012 | |
| WO | 2019/047126 | A1 | 3/2019 | |
| WO | 2019/058106 | A1 | 3/2019 | |
| WO | WO-2019-047126 | * | 3/2019 | ............... G09G 3/20 |

OTHER PUBLICATIONS

Korean Office Action dated Nov. 20, 2024, issued in Korean Application No. 10-2020-0048178.

Korean Notice of Patent Grant dated Feb. 26, 2025, issued in Korean Application No. 10-2020-0048178.

* cited by examiner

ELECTRONIC DEVICE COMPRISING OPTICAL SENSOR AND ENCAPSULATION LAYERS

CROSS-REFERENCE TO RELATED APPLICATION(S)

This application is a continuation application, claiming priority under § 365(c), of an International application No. PCT/KR2021/004975, filed on Apr. 21, 2021, which is based on and claims the benefit of a Korean patent application number 10-2020-0048178, filed on Apr. 21, 2020, in the Korean Intellectual Property Office, the disclosure of which is incorporated by reference herein in its entirety.

BACKGROUND

1. Field

The disclosure relates to an electronic device including an optical sensor.

2. Description of Related Art

Electronic devices, for example, portable electronic devices, are being released with various sizes according to their function and users' preference, and may include large-screen touch displays for guaranteeing wide visibility and convenience of manipulation. An electronic device may include at least one optical sensor (for example, an image sensor, a fingerprint sensor, a camera module). For example, an electronic device may include at least one optical sensor disposed on the periphery of a display or through at least part of the display.

The above information is presented as background information only to assist with an understanding of the disclosure. No determination has been made, and no assertion is made, as to whether any of the above might be applicable as prior art with regard to the disclosure.

SUMMARY

In an electronic device to which a under display camera (UDC) is applied, a display may operate even on an area corresponding to a camera, and transmissivity of a under display camera area (for example, a sensor area) should be enhanced in order to increase photographing quality of the camera. In order to increase the transmissivity of the under display camera area, some pixels and some drive circuits (for example, a thin film transistor (TFT) circuit) of the under display camera area may be removed. When an organic light emitting diodes (OLED) panel is applied to the electronic device, an encapsulation area including a border of the panel should be shielded from external factors. When some components of an encapsulation portion are removed from the under display camera area, there may be a deviation in thickness, and a structure for compensating for the deviation in thickness should be applied. If an air gap is formed without compensating for the deviation in thickness caused by removal of some components of the encapsulation portion, transmissivity may be degraded due to the air gap and a step may be formed, and accordingly, it may be difficult to form a touch pattern (or a touch panel) on the encapsulation portion.

Aspects of the disclosure are to address at least the above-mentioned problems and/or disadvantages and to provide at least the advantages described below. Accordingly, an aspect of the disclosure is to remove some pixels and some drive circuits of an under display camera area and some components of an encapsulation portion, when a under display camera (UDC) is applied to an electronic device. An index matching layer may be formed on the portion from which some components of the encapsulation portion are removed, so that a deviation in thickness caused by removal of some components of the encapsulation portion may be prevented. Transmissivity of the under display camera area may be enhanced, and an upper surface of the encapsulation portion may be smoothened, so that a touch pattern (or a touch pattern) may be disposed on the encapsulation portion.

Additional aspects will be set forth in part in the description which follows and, in part, will be apparent from the description, or may be learned by practice of the presented embodiments.

In accordance with an aspect of the disclosure, an electronic device is provided. The electronic device includes a display panel and one or more optical sensors. The display panel may be disposed in an inner space of a housing to be visible from the outside, and includes a display area and a sensor area. The one or more optical sensors may correspond to the sensor area under the display panel. The display panel includes a plurality of pixels disposed over a substrate, a plurality of drive circuits for driving the plurality of pixels, a first encapsulation portion for encapsulating the sensor area, and a second encapsulation portion for encapsulating the display area. The first encapsulation portion and the second encapsulation portion may have different stacked structures of layers.

The sensor area of the electronic device includes a pixel area where the plurality of first pixels are disposed, and a non-pixel area where pixels are not disposed. The first encapsulation portion includes a pixel area encapsulation portion for encapsulating the pixel area, and a non-pixel area encapsulation portion for encapsulating the non-pixel area.

The pixel area encapsulation portion of the electronic device includes an organic layer, and the non-pixel area encapsulation portion may not include the organic layer.

The pixel area encapsulation portion of the electronic device includes at least two layers of a first inorganic layer, the organic layer over the first inorganic layer, a second inorganic layer over the organic layer, and a third inorganic layer over the second inorganic layer.

The non-pixel area encapsulation portion of the electronic device includes the third inorganic layer and an index matching portion over the third inorganic layer.

The non-pixel area encapsulation portion of the electronic device includes the first inorganic layer, the third inorganic layer over the first inorganic layer, and the index matching portion over the third inorganic layer.

In the electronic device, an upper surface of the pixel area encapsulation area and an upper surface of the non-pixel area encapsulation portion may be formed with the same height.

In the electronic device, an upper surface of the first encapsulation portion and an upper surface of the second encapsulation portion may be formed with the same height.

The second encapsulation portion of the electronic device includes the first inorganic layer, the organic layer over the first inorganic layer, the second inorganic layer over the organic layer, and the third inorganic layer over the second inorganic layer.

The electronic device further includes at least one of a touch panel, a polarizing film, or a window disposed on the display panel.

An electronic device according to various embodiments of the disclosure may include a display panel and one or more optical sensors. The display panel may be disposed in an inner space of a housing to be visible from the outside, and includes a display area and a sensor area. The one or more optical sensors may correspond to the sensor area under the display panel. The display panel includes a plurality of pixels disposed over a substrate, a plurality of drive circuits for driving the plurality of pixels, a first encapsulation portion for encapsulating the sensor area, and a second encapsulation portion for encapsulating the display area. A first portion of the first encapsulation portion may encapsulate a pixel area where the first pixels are formed. A second portion of the first encapsulation portion may encapsulate a transmission area where the pixels are not formed.

The first portion of the first encapsulation portion of the electronic device may have the same stacked structure of layers as the second encapsulation portion. The second portion of the first encapsulation portion may have a different layered structure of layers from that of the second encapsulation portion.

The first portion of the first encapsulation portion of the electronic device includes an organic layer, and the second portion of the first encapsulation portion may not include the organic layer.

The first portion of the first encapsulation portion of the electronic device includes a first inorganic layer, the organic layer over the first inorganic layer, a second inorganic layer over the organic layer, a third inorganic layer over the second inorganic layer.

The second portion of the first encapsulation portion of the electronic device includes the third inorganic layer and an index matching portion over the third inorganic layer.

The second portion of the first encapsulation portion of the electronic device includes the first inorganic layer, the third inorganic layer over the first inorganic layer, and the index matching portion over the third inorganic layer.

An upper surface of the first portion of the first encapsulation portion of the electronic device, and an upper surface of the second portion of the first encapsulation portion may be formed with the same height.

An upper surface of the first encapsulation portion of the electronic device, and an upper surface of the second encapsulation portion may be formed with the same height.

The second encapsulation portion of the electronic device includes the first inorganic layer, the organic layer over the first inorganic layer, the second inorganic layer over the organic layer, and the third inorganic layer over the second inorganic layer.

The electronic device includes a touch panel, a polarizing film, and a window disposed on the display panel.

According to various embodiments of the disclosure, an upper surface of a first encapsulation portion for encapsulating an under display camera area (for example, a sensor area), and an upper surface of a second encapsulation portion for encapsulating a display area may be formed with the same height, thereby being smoothened. An upper surface of a pixel area encapsulation portion of the first encapsulation portion, and an upper surface of a non-pixel area encapsulation portion may be formed with the same height, thereby being smoothened. Accordingly, a touch panel (or a touch pattern) may be smoothly formed over the encapsulation portion.

According to various embodiments, a drive circuit and pixels may be removed from a non-pixel area (or a transmission area), and an index matching portion may be formed, so that transmissivity of an under display camera area may be enhanced. Through this, quality of an image and a video of an electronic device may be enhanced.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
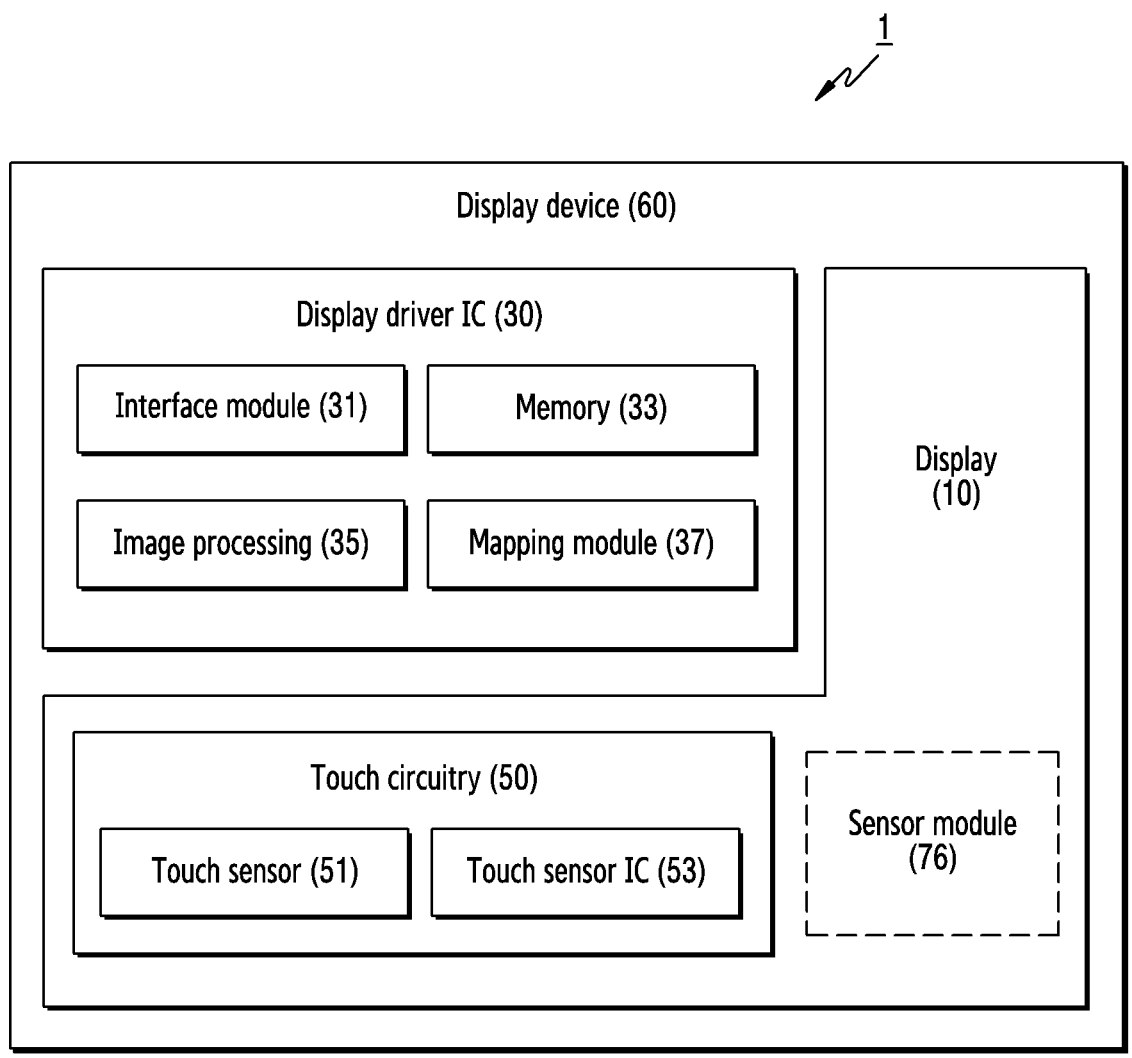
FIG. 1 is a block diagram of a display device according to an embodiment of the disclosure.

FIG. 1 is a block diagram 1 illustrating the display device 60 according to an embodiment of the disclosure.

Referring to FIG. 1, the display device 60 may include a display 10 and a display driver integrated circuit (DDI) 30 to control the display 10. The DDI 30 may include an interface module 31, memory 33 (e.g., buffer memory), an image processing module 35, or a mapping module 37. The DDI 30 may receive image information that contains image data or an image control signal corresponding to a command to control the image data from another component of the electronic device 1001 via the interface module 31. For example, according to an embodiment, the image information may be received from the processor 1020 (e.g., the main processor 1021 (e.g., an application processor)) or the auxiliary processor 1023 (e.g., a graphics processing unit) operated independently from the function of the main processor 1021. The DDI 30 may communicate, for example, with touch circuitry 1050 or the sensor module 76 via the interface module 31. The DDI 30 may also store at least part of the received image information in the memory 33, for example, on a frame by frame basis. The image processing module 35 may perform pre-processing or post-processing (e.g., adjustment of resolution, brightness, or size) with respect to at least part of the image data. According to an embodiment, the pre-processing or post-processing may be performed, for example, based at least in part on one or more characteristics of the image data or one or more characteristics of the display 10. The mapping module 37 may generate a voltage value or a current value corresponding to the image data pre-processed or post-processed by the image processing module 35. According to an embodiment, the generating of the voltage value or current value may be performed, for example, based at least in part on one or more attributes of the pixels (e.g., an array, such as an RGB stripe or a pentile structure, of the pixels, or the size of each subpixel). At least some pixels of the display 10 may be driven, for example, based at least in part on the voltage value or the current value such that visual information (e.g., a text, an image, or an icon) corresponding to the image data may be displayed via the display 10.

According to an embodiment, the display device 60 may further include the touch circuitry 50. The touch circuitry 50 may include a touch sensor 51 and a touch sensor IC 53 to control the touch sensor 51. The touch sensor IC 53 may control the touch sensor 51 to sense a touch input or a hovering input with respect to a certain position on the display 10. To achieve this, for example, the touch sensor 51 may detect (e.g., measure) a change in a signal (e.g., a voltage, a quantity of light, a resistance, or a quantity of one or more electric charges) corresponding to the certain position on the display 10. The touch circuitry 50 may provide input information (e.g., a position, an area, a pressure, or a time) indicative of the touch input or the hovering input detected via the touch sensor 51 to the processor 1020. According to an embodiment, at least part (e.g., the touch sensor IC 53) of the touch circuitry 50 may be formed as part of the display 10 or the DDI 30, or as part of another component (e.g., the auxiliary processor 1023) disposed outside the display device 60.

According to an embodiment, the display device 60 may further include at least one sensor (e.g., a fingerprint sensor, an iris sensor, a pressure sensor, or an illuminance sensor) of the sensor module 76 or a control circuit for the at least one sensor. In such a case, the at least one sensor or the control circuit for the at least one sensor may be embedded in one portion of a component (e.g., the display 10, the DDI 30, or the touch circuitry 1050)) of the display device 60. For example, when the sensor module 76 embedded in the display device 60 includes a biometric sensor (e.g., a fingerprint sensor), the biometric sensor may obtain biometric information (e.g., a fingerprint image) corresponding to a touch input received via a portion of the display 10. As another example, when the sensor module 76 embedded in the display device 60 includes a pressure sensor, the pressure sensor may obtain pressure information corresponding to a touch input received via a partial or whole area of the display 10. According to an embodiment, the touch sensor 51 or the sensor module 76 may be disposed between pixels in a pixel layer of the display 10, or over or under the pixel layer.

Figure 2:
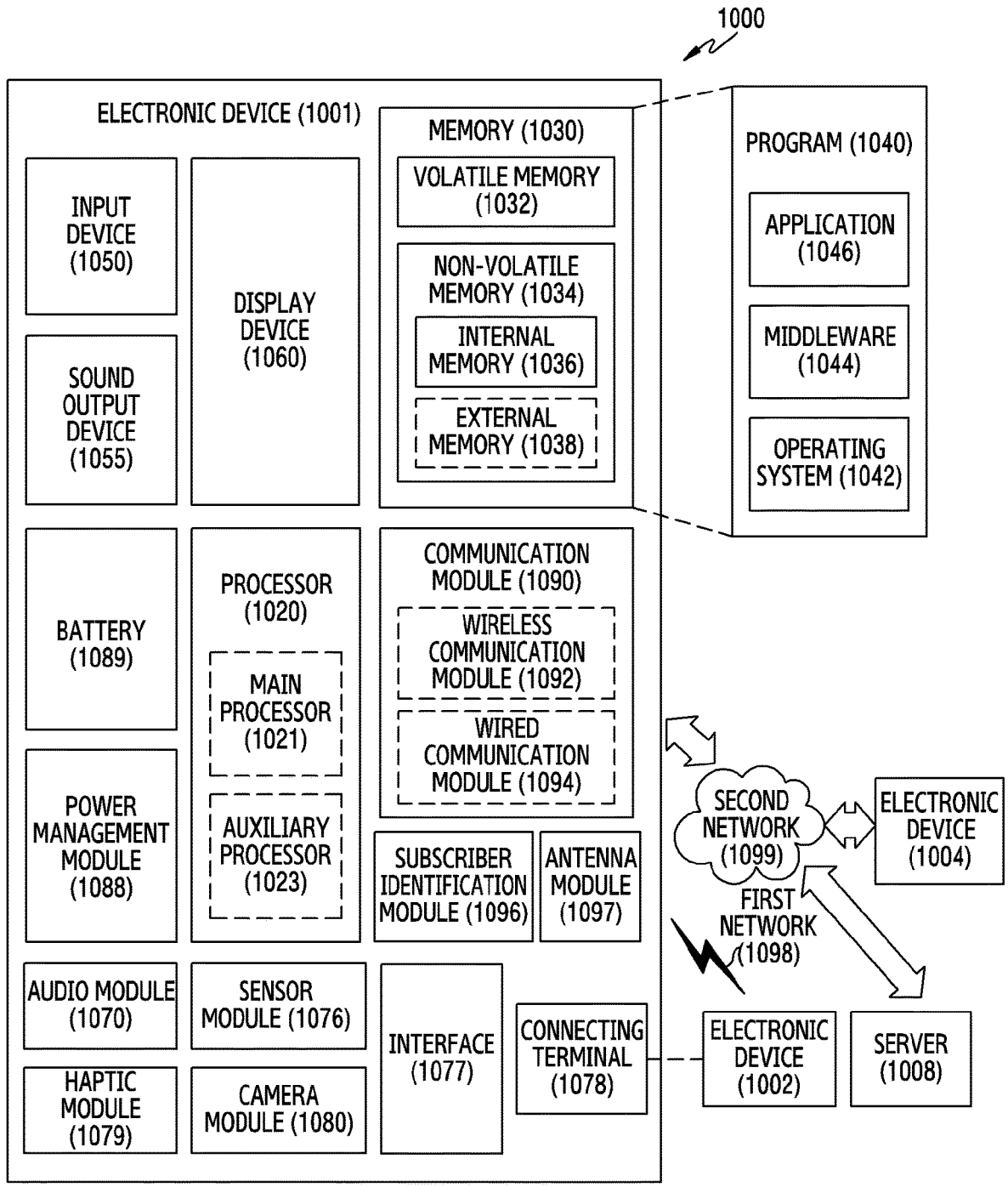
FIG. 2 is a block diagram of an electronic device in a network environment according to an embodiment of the disclosure.

FIG. 2 is a block diagram illustrating an electronic device 1001 in a network environment 1000 according to an embodiment of the disclosure.

Referring to FIG. 2, the electronic device 1001 in the network environment 1000 may communicate with an electronic device 1002 via a first network 1098 (e.g., a short-range wireless communication network), or an electronic device 1004 or a server 1008 via a second network 1099 (e.g., a long-range wireless communication network). According to an embodiment, the electronic device 1001 may communicate with the electronic device 1004 via the server 1008. According to an embodiment, the electronic device 1001 may include a processor 1020, memory 1030, an input device 1050, a sound output device 1055, a display device 60, an audio module 1070, a sensor module 76, an interface 1077, a haptic module 1079, a camera module 1080, a power management module 1088, a battery 1089, a communication module 1090, a subscriber identification module (SIM) 1096, or an antenna module 1097. In some embodiments, at least one (e.g., the display device 60 or the camera module 1080) of the components may be omitted from the electronic device 1001, or one or more other components may be added in the electronic device 1001. In some embodiments, some of the components may be implemented as single integrated circuitry. For example, the sensor module 76 (e.g., a fingerprint sensor, an iris sensor, or an illuminance sensor) may be implemented as embedded in the display device 60 (e.g., a display).

The processor 1020 may execute, for example, software (e.g., a program 1040) to control at least one other component (e.g., a hardware or software component) of the electronic device 1001 coupled with the processor 1020, and may perform various data processing or computation. According to one embodiment, as at least part of the data processing or computation, the processor 1020 may load a command or data received from another component (e.g., the sensor module 76 or the communication module 1090) in volatile memory 1032, process the command or the data stored in the volatile memory 1032, and store resulting data in non-volatile memory 1034. According to an embodiment, the processor 1020 may include a main processor 1021 (e.g., a central processing unit (CPU) or an application processor (AP)), and an auxiliary processor 1023 (e.g., a graphics processing unit (GPU), an image signal processor (ISP), a sensor hub processor, or a communication processor (CP)) that is operable independently from, or in conjunction with, the main processor 1021. Additionally or alternatively, the auxiliary processor 1023 may be adapted to consume less power than the main processor 1021, or to be specific to a specified function. The auxiliary processor 1023 may be implemented as separate from, or as part of the main processor 1021.

The auxiliary processor 1023 may control at least some of functions or states related to at least one component (e.g., the display device 60, the sensor module 76, or the communication module 1090) among the components of the electronic device 1001, instead of the main processor 1021 while the main processor 1021 is in an inactive (e.g., sleep) state, or together with the main processor 1021 while the main processor 1021 is in an active state (e.g., executing an application). According to an embodiment, the auxiliary processor 1023 (e.g., an image signal processor or a communication processor) may be implemented as part of another component (e.g., the camera module 1080 or the communication module 1090) functionally related to the auxiliary processor 1023.

The memory 1030 may store various data used by at least one component (e.g., the processor 1020 or the sensor module 76) of the electronic device 1001. The various data may include, for example, software (e.g., the program 1040) and input data or output data for a command related thereto. The memory 1030 may include the volatile memory 1032 or the non-volatile memory 1034.

The program 1040 may be stored in the memory 1030 as software, and may include, for example, an operating system (OS) 1042, middleware 1044, or an application 1046.

The input device 1050 may receive a command or data to be used by another component (e.g., the processor 1020) of the electronic device 1001, from the outside (e.g., a user) of the electronic device 1001. The input device 1050 may include, for example, a microphone, a mouse, a keyboard, or a digital pen (e.g., a stylus pen).

The sound output device 1055 may output sound signals to the outside of the electronic device 1001. The sound output device 1055 may include, for example, a speaker or a receiver. The speaker may be used for general purposes, such as playing multimedia or playing record, and the receiver may be used for incoming calls. According to an embodiment, the receiver may be implemented as separate from, or as part of the speaker.

The display device 60 may visually provide information to the outside (e.g., a user) of the electronic device 1001. The display device 60 may include, for example, a display, a hologram device, or a projector and control circuitry to control a corresponding one of the display, hologram device, and projector. According to an embodiment, the display device 60 may include touch circuitry adapted to detect a touch, or sensor circuitry (e.g., a pressure sensor) adapted to measure the intensity of force incurred by the touch.

The audio module 1070 may convert a sound into an electrical signal and vice versa. According to an embodiment, the audio module 1070 may obtain the sound via the input device 1050, or output the sound via the sound output device 1055 or a headphone of an external electronic device (e.g., an electronic device 1002) directly (e.g., wiredly) or wirelessly coupled with the electronic device 1001.

The sensor module 76 may detect an operational state (e.g., power or temperature) of the electronic device 1001 or an environmental state (e.g., a state of a user) external to the electronic device 1001, and then generate an electrical signal or data value corresponding to the detected state. According to an embodiment, the sensor module 76 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 1077 may support one or more specified protocols to be used for the electronic device 1001 to be coupled with the external electronic device (e.g., the electronic device 1002) directly (e.g., wiredly) or wirelessly. According to an embodiment, the interface 1077 may include, for example, a high definition multimedia interface (HDMI), a universal serial bus (USB) interface, a secure digital (SD) card interface, or an audio interface.

A connecting terminal 1078 may include a connector via which the electronic device 1001 may be physically connected with the external electronic device (e.g., the electronic device 1002). According to an embodiment, the connecting terminal 1078 may include, for example, a HDMI connector, a USB connector, an SD card connector, or an audio connector (e.g., a headphone connector).

The haptic module 1079 may convert an electrical signal into a mechanical stimulus (e.g., a vibration or a movement) or electrical stimulus which may be recognized by a user via his tactile sensation or kinesthetic sensation. According to an embodiment, the haptic module 1079 may include, for example, a motor, a piezoelectric element, or an electric stimulator.

The camera module 1080 may capture a still image or moving images. According to an embodiment, the camera module 1080 may include one or more lenses, image sensors, image signal processors, or flashes.

The power management module 1088 may manage power supplied to the electronic device 1001. According to one embodiment, the power management module 1088 may be implemented as at least part of, for example, a power management integrated circuit (PMIC).

The battery 1089 may supply power to at least one component of the electronic device 1001. According to an embodiment, the battery 1089 may include, for example, a primary cell which is not rechargeable, a secondary cell which is rechargeable, or a fuel cell.

The communication module 1090 may support establishing a direct (e.g., wired) communication channel or a wireless communication channel between the electronic device 1001 and the external electronic device (e.g., the electronic device 1002, the electronic device 1004, or the server 1008) and performing communication via the established communication channel. The communication module 1090 may include one or more communication processors that are operable independently from the processor 1020 (e.g., the application processor (AP)) and supports a direct (e.g., wired) communication or a wireless communication. According to an embodiment, the communication module 1090 may include a wireless communication module 1092 (e.g., a cellular communication module, a short-range wireless communication module, or a global navigation satellite system (GNSS) communication module) or a wired communication module 1094 (e.g., a local area network (LAN) communication module or a power line communication (PLC) module). A corresponding one of these communication modules may communicate with the external electronic device via the first network 1098 (e.g., a short-range communication network, such as Bluetooth™, wireless-fidelity (Wi-Fi) direct, or infrared data association (IrDA)) or the second network 1099 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 1092 may identify and authenticate the electronic device 1001 in a communication network, such as the first network 1098 or the second network 1099, using subscriber information (e.g., international mobile subscriber identity (IMSI)) stored in the subscriber identification module 1096.

The antenna module 1097 may transmit or receive a signal or power to or from the outside (e.g., the external electronic device) of the electronic device 1001. According to an embodiment, the antenna module 1097 may include an antenna including a radiating element composed of a conductive material or a conductive pattern formed in or on a substrate (e.g., printed circuit board (PCB)). According to an embodiment, the antenna module 1097 may include a plurality of antennas. In such a case, at least one antenna appropriate for a communication scheme used in the communication network, such as the first network 1098 or the second network 1099, may be selected, for example, by the communication module 1090 (e.g., the wireless communication module 1092) from the plurality of antennas. The signal or the power may then be transmitted or received between the communication module 1090 and the external electronic device via the selected at least one antenna. According to an embodiment, another component (e.g., a radio frequency integrated circuit (RFIC)) other than the radiating element may be additionally formed as part of the antenna module 1097.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 1001 and the external electronic device 1004 via the server 1008 coupled with the second network 1099. Each of the electronic devices 1002 and 1004 may be a device of a same type as, or a different type, from the electronic device 1001. According to an embodiment, all or some of operations to be executed at the electronic device 1001 may be executed at one or more of the external electronic devices 1002 or 1004, or the server 1008. For example, if the electronic device 1001 should perform a function or a service automatically, or in response to a request from a user or another device, the electronic device 1001, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 1001. The electronic device 1001 may provide the outcome, with or without further processing of the outcome, as at least part of a reply to the request. To that end, a cloud computing, distributed computing, or client-server computing technology may be used, for example.

Figure 3A:
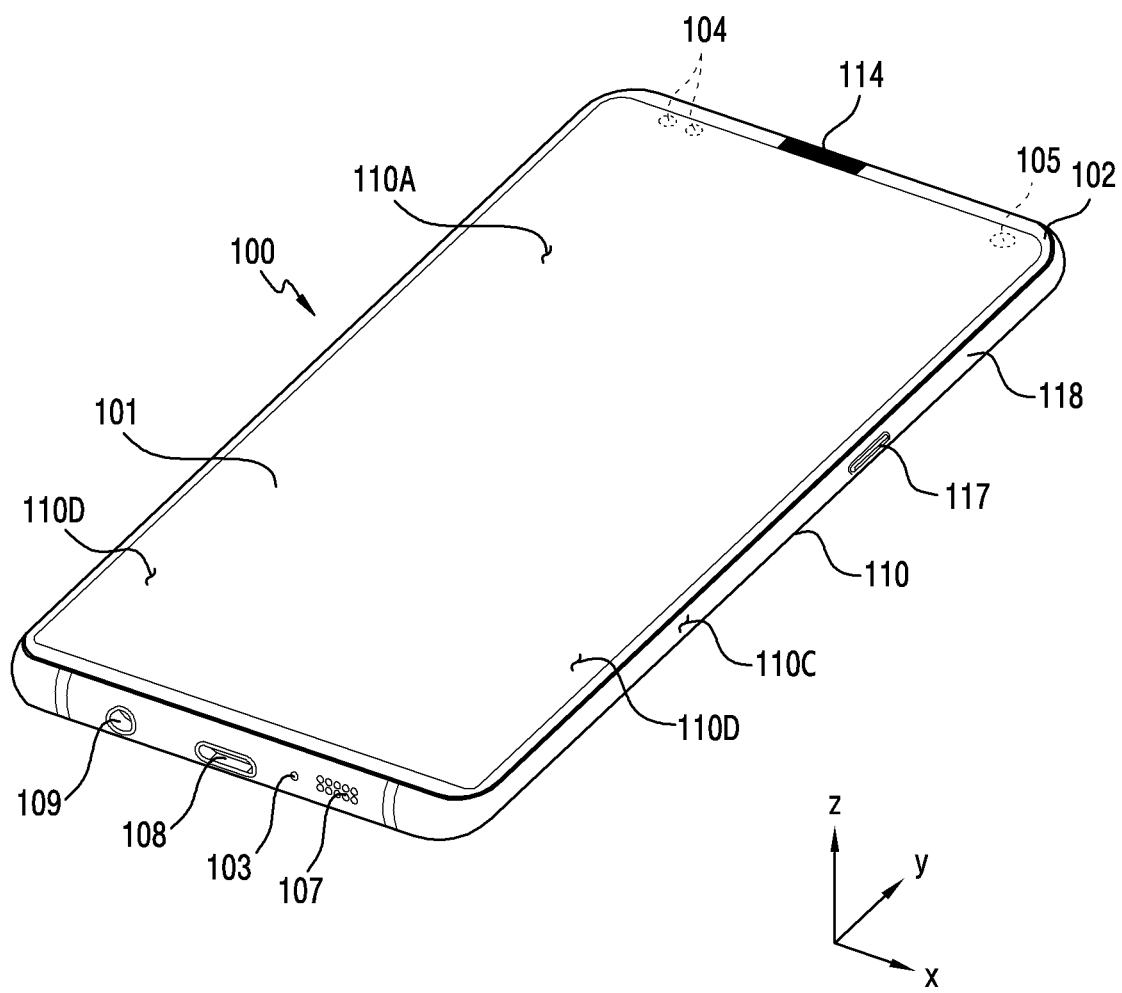
FIG. 3A is a perspective view of a front surface of a mobile electronic device according to an embodiment of the disclosure.
Figure 3B:
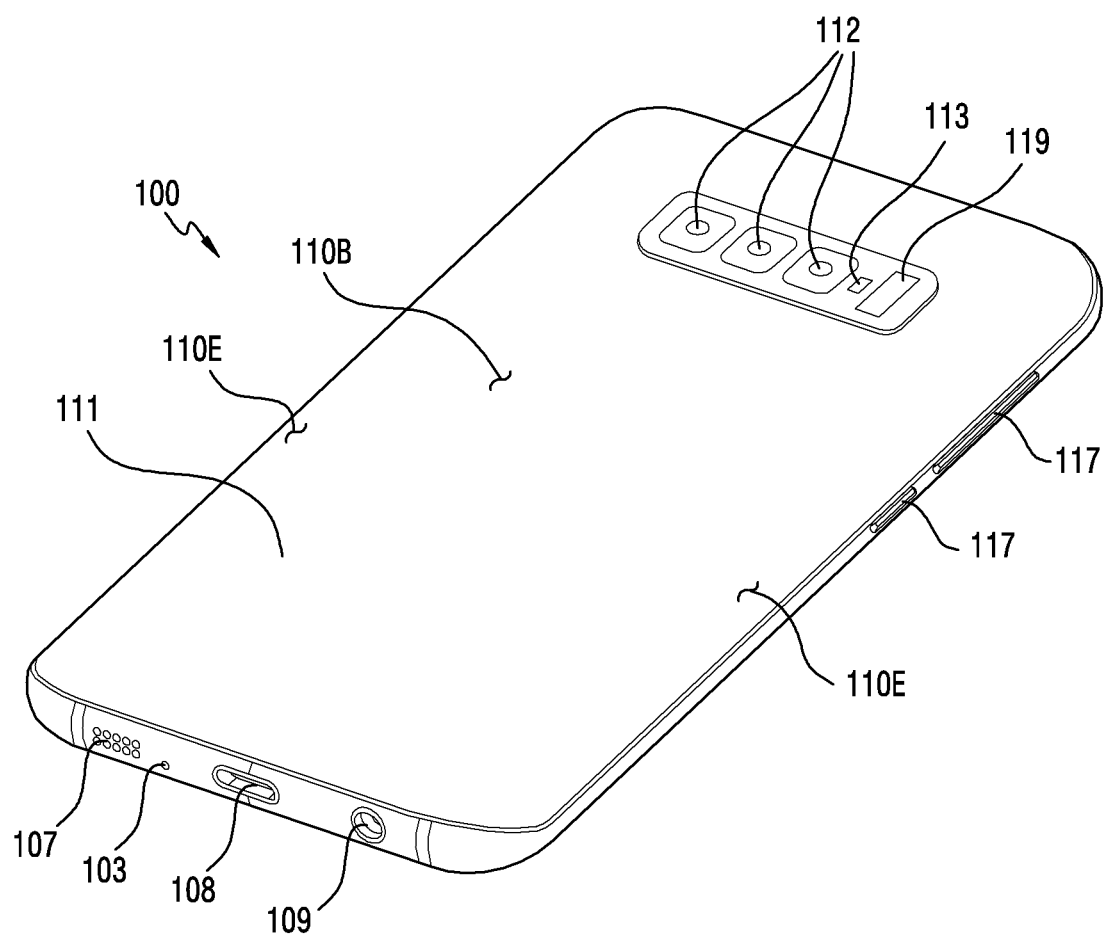
FIG. 3B is a perspective view of a rear surface of the electronic device of FIG. 1 according to an embodiment of the disclosure.

FIG. 3A is a perspective view of a front surface of a mobile electronic device 100 according to an embodiment of the disclosure. FIG. 3B is a perspective view of a rear surface of the electronic device 100 of FIG. 1 according to an embodiment of the disclosure.

Referring to FIGS. 3A and 3B, the electronic device 100 according to an embodiment may include a housing 110 which includes a first surface (or a front surface) 110A, a second surface (or a rear surface) 110B, and a side surface 110C surrounding a space between the first surface 110A and the second surface 110B. In another embodiment (not shown), the housing may refer to a structure that forms a part of the first surface 110A, the second surface 110B, and the side surface 110C of FIG. 1. According to an embodiment, the first surface 110A may be formed by a front surface plate 102 having at least part substantially transparent (for example, a glass plate including various coating layers, or a polymer plate). The second surface 110B may be formed by a rear surface plate 111 which is substantially opaque. The rear surface plate 111 may be formed by, for example, coated or colored glass, ceramic, a polymer, metal (for example, aluminum, stainless steel (STS), or magnesium), or a combination of at least two of the above-mentioned materials. The side surface 110C may be formed by a side surface bezel structure 118 (or a "side surface member") which is coupled with the front surface plate 102 and the rear surface plate 111, and includes metal and/or a polymer. In a certain embodiment, the rear surface plate 111 and the side surface bezel structure 118 may be integrally formed with each other, and may include the same material (for example, a metallic material such as aluminum).

In the illustrated embodiment, the front surface plate 102 may include two first areas 110D bent from the first surface 110A toward the rear surface plate 111 and seamlessly extended, and disposed on both ends of long edges of the front surface plate 102. In the illustrated embodiment (see FIG. 3B), the rear surface plate 111 may include two second areas 110E bent from the second surface 110B toward the front surface plate 102 and seamlessly extended, and disposed on both ends of long edges. In a certain embodiment, the front surface plate 102 (or the rear surface plate 111) may include only one of the first areas 110D (or the second areas 110E). In a certain embodiment, a part of the first areas 110D or the second areas 110E may not be included. In the above-described embodiments, when viewed from a side surface of the electronic device 100, the side surface bezel structure 118 may have a first thickness (or width) on a side surface that does not include the first areas 110D or the second areas 110E described above, and may have a second thickness thinner than the first thickness on a side surface that includes the first areas 110D or the second areas 110E.

According to an embodiment, the electronic device 100 may include at least one of a display 101, an input device 103, audio output devices 107, 114, sensor modules 104, 119, camera modules 105, 112, 113, a key input device 117, an indicator (not shown), and connectors 108, 109. In a certain embodiment, the electronic device 100 may omit at least one of the components (for example, the key input device 117 or the indicator) or may additionally include other components.

The display 101 may be visible through an upper end portion of the front surface plate 102, for example. In a certain embodiment, at least part of the display 101 may be visible through the front surface plate 102 forming the first surface 110A and the first area 110D of the side surface 110C. The display 101 may be coupled with or may be disposed adjacent to a touch sensing circuit, a pressure sensor for measuring an intensity (pressure) of a touch, and/or a digitizer for detecting a stylus pen of a magnetic field method. In a certain embodiment, at least part of the sensor modules 104, 119, and/or at least part of the key input device 117 may be disposed on the first area 110D and/or the second area 110E.

In a certain embodiment (not shown), the electronic device may include at least one of the audio module 114, the sensor module 104, the camera module 105 (for example, an optical sensor, an image sensor), and a fingerprint sensor on a rear surface of a screen display area of the display 101. In a certain embodiment (not shown), the display 101 may be coupled with or may be disposed adjacent to a touch sensing circuit, a pressure sensor for measuring an intensity (pressure) of a touch, and/or a digitizer for detecting a stylus pen of a magnetic field method. In a certain embodiment, at least part of the sensor modules 104, 119, and/or at least part of the key input device 117 may be disposed on the first area 110D and/or the second area 110E.

The input device 103 may include a microphone. In a certain embodiment, the input device 103 may include a plurality of microphones disposed to detect a direction of a sound. The audio output devices 107, 114 may include speakers 107, 114. The speakers 107, 114 may include an external speaker 107 and a receiver 114 for calling (for example, an audio module). In a certain embodiment, the input device 103 (for example, the microphone), the speakers 107, 114, and the connectors 108, 109 may be disposed in the space of the electronic device 100, and may be exposed to an external environment through at least one hole formed on the housing 110. In a certain embodiment, the hole formed on the housing 110 may be used for the input device 103 (for example, the microphone) and the speakers 107, 114 in common. In a certain embodiment, the speakers 107, 114 may include a speaker (for example, a piezo speaker) which operates regardless of the presence/absence of the hole formed on the housing 110.

The sensor modules 104, 119 may generate an electric signal or a data value corresponding to an internal operation state or an external environment state of the electronic device 100. The sensor modules 104, 119 may include, for example, a first sensor module 104 (for example, a proximity sensor) and/or a second sensor module (not shown) (for example, a fingerprint sensor) disposed on the first surface 110A of the housing 110, and/or a third sensor module 119 (for example, an heart rate monitor (HRM) sensor) disposed on the second surface 110B of the housing 110. The fingerprint sensor may be disposed not only on the first surface 110A of the housing 110 (for example, the display 101), but also on the second surface 110B. The electronic device 100 may further include a sensor module (not shown), for example, at least one of a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera modules 105, 112, 113 may include a first camera module 105 disposed on the first surface 110A of the electronic device 100, and a second camera module 112 and/or a flash 113 disposed on the second surface 110B. The camera modules 105, 112 may include one or a plurality of lenses, an image sensor, and/or an image signal processor. The flash 113 may include, for example, a light emitting diode or a xenon lamp. The first camera module 105 may be disposed on a lower portion of a display panel in a method of an under display camera (UDC). In a certain embodiment, two or more lenses (a wide-angle lens and a telephoto lens) and image sensors may be disposed on one surface of the electronic device 100. In a certain embodiment, a plurality of first camera modules 105 may be disposed on the first surface (for example, a surface on which a screen is displayed) of the electronic device 100 in the method of the under display camera (UDC).

The key input device 117 may be disposed on the side surface 110C of the housing 110. In another embodiment, the electronic device 100 may not include a part or an entirety of the key input device 117 mentioned above, and the key input device 117 that is not included may be implemented on the display 101 in other forms such as a soft key. In a certain embodiment, the key input device 117 may be implemented by using a pressure sensor included in the display 101.

The indicator may be disposed on the first surface 110A of the housing 110, for example. For example, the indicator may provide state information of the electronic device 100 in the form of light. In another embodiment, the indicator may provide a light source interlocking with an operation of the camera module 105. The indicator may include, for example, a light emitting diode (LED), an infrared LED (IR LED), and a xenon lamp.

The connectors 108, 109 may include a first connector hole 108 to accommodate a connector (for example, a USB connector) for exchanging power and/or data with an external electronic device, and/or a second connector hole 109 (for example, an earphone jack) to accommodate a connector for exchanging an audio signal with an external electronic device.

Some camera module 105 of the camera modules 105, 112, some sensor module 104 of the sensor modules 104, 119, or the indicator may be disposed to be visible through the display 101. The camera module 105 may be disposed to overlap a display area, and a screen may be displayed even on the display area corresponding to the camera module 105. Some sensor module 104 may be disposed in the inner space of the electronic device to perform its function without being visually exposed through the front surface plate 102.

Figure 4:
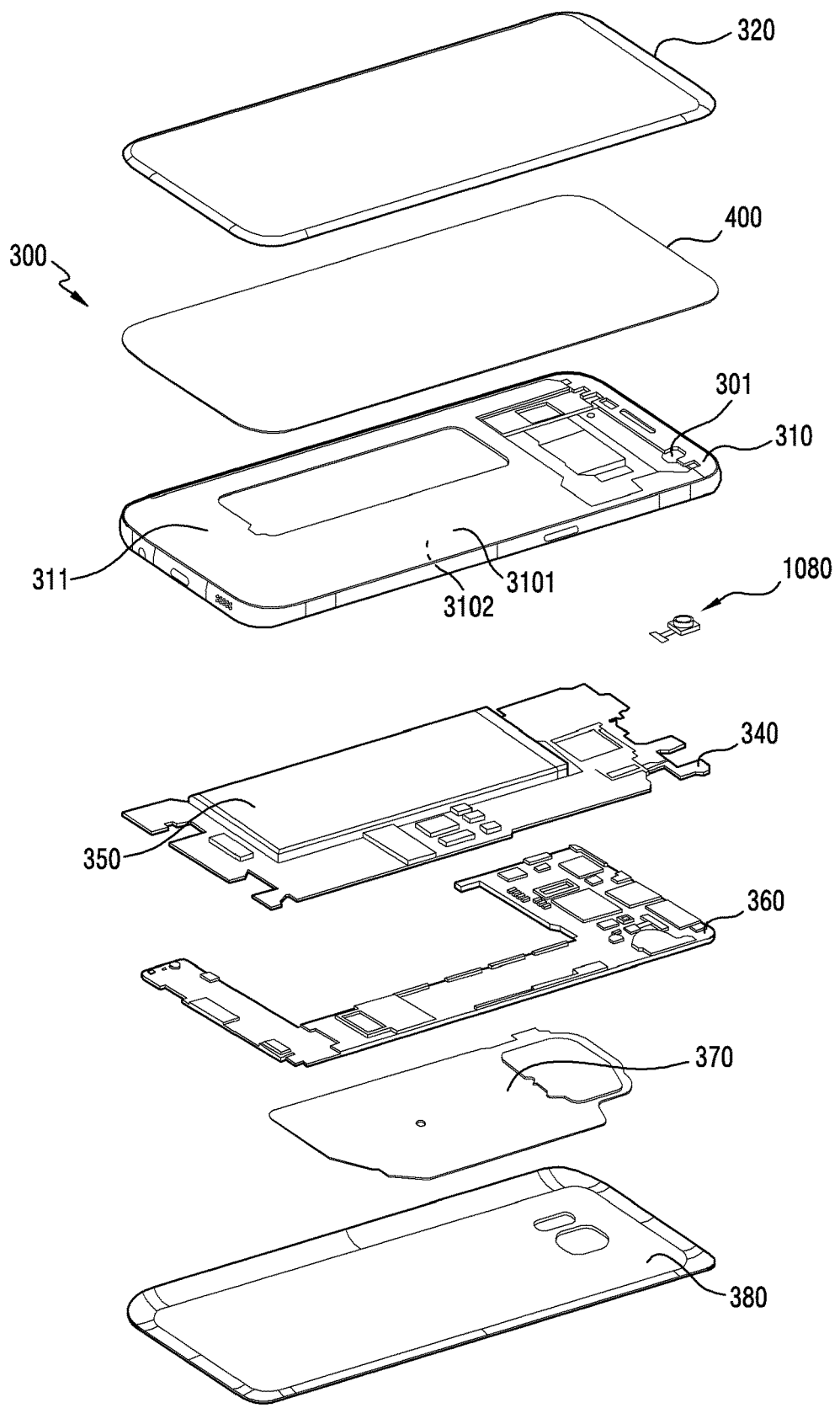
FIG. 4 is an exploded perspective view of an electronic device according to an embodiment of the disclosure.

FIG. 4 is an exploded perspective view of an electronic device 300 according to an embodiment of the disclosure.

Referring to FIG. 4, the electronic device 300 (for example, the electronic device 100 of FIGS. 3A and 3B) may include a side surface member 310 (for example, a side surface bezel structure), a first support member 311 (for example, a bracket or a support structure), a front surface plate 320 (for example, a front surface cover), a display 400, a printed circuit board 340, a battery 350, a second support member 360 (for example a rear case), an antenna 370, and a rear surface plate 380 (for example, a rear surface cover). In a certain embodiment, the electronic device 300 may omit at least one (for example, the first support member 311 or the second support member 360) of the components, or may additionally include other components. At least one of the components of the electronic device 300 may be the same as or similar to at least one of the components of the electronic device 100 of FIG. 1 or 2, and a redundant explanation thereof is omitted.

The first support member 311 may be disposed inside the electronic device 300 to be connected with the side surface member 310, or may be integrally formed with the side surface member 310. For example, the first support member 311 may be formed with a metallic material and/or a nonmetallic material (for example, polymer). The first support member 311 may have one surface coupled with the display 400 and the other surface coupled with the printed circuit board 340. A processor, a memory, and/or an interface may be mounted on the printed circuit board 340. The processor may include, for example, one or more of a central processing device, an application processor, a graphic processing device, an image signal processor, a sensor hub processor, or a communication processor.

The memory may include, for example, the volatile memory 1032 of FIG. 2 and/or the non-volatile memory 1034 of FIG. 2.

The interface may include, for example, a high definition multimedia interface (HDMI), a universal serial bus (USB) interface, a secure digital (SD) card interface, and/or an audio interface. The interface may electrically or physically connect the electronic device 300 with an external electronic device, and may include a USB connector, an SD card/MMC connector, or an audio connector.

The battery 350 may be a device that supplies power to at least one component of the electronic device 300, and may include, for example, a primary battery which is not rechargeable or a secondary battery which is rechargeable, or a fuel cell. At least part of the battery 350 may be disposed substantially on the same plane as the printed circuit board 340, for example. The battery 350 may be integrally disposed inside the electronic device 300. In another embodiment, the battery 350 may be attachably and detachably disposed in the electronic device 300.

The antenna 370 may be disposed between the rear surface plate 380 and the battery 350. The antenna 370 may include, for example, a near field communication (NFC) antenna, a wireless charging antenna, and/or a magnetic secure transmission (MST) antenna. The antenna 370 may perform short-range communication with an external device, or may wirelessly transmit and receive power necessary for charging. In another embodiment, an antenna structure may be formed by a part of the side surface bezel member 310 and/or the first support member 311, or a combination thereof.

According to various embodiments, the first support member 311 of the side surface member 310 may include a first surface 3101 facing the front surface plate 320, and a second surface 3102 facing in the opposite direction of the first surface 3101 (for example, in the direction toward the rear surface plate). According to a certain embodiment, a camera module 1080 (for example, the camera module 1080 of FIG. 2) may be disposed between the first support member 311 and the rear surface plate 380. According to a certain embodiment, the camera module 1080 may be disposed to protrude toward the front surface plate 320 or to be visible through a penetrating hole 301 connected from the first surface 3101 of the first support member 311 to the second surface 3102. According to a certain embodiment, a portion of the camera module 1080 that protrudes through the penetrating hole 301 may be disposed to detect an external environment on a position corresponding to the display 400. In another embodiment, when the camera module 1080 is disposed between the display 400 and the first support member 311, the penetrating hole 301 may not be required.

Figure 5A:
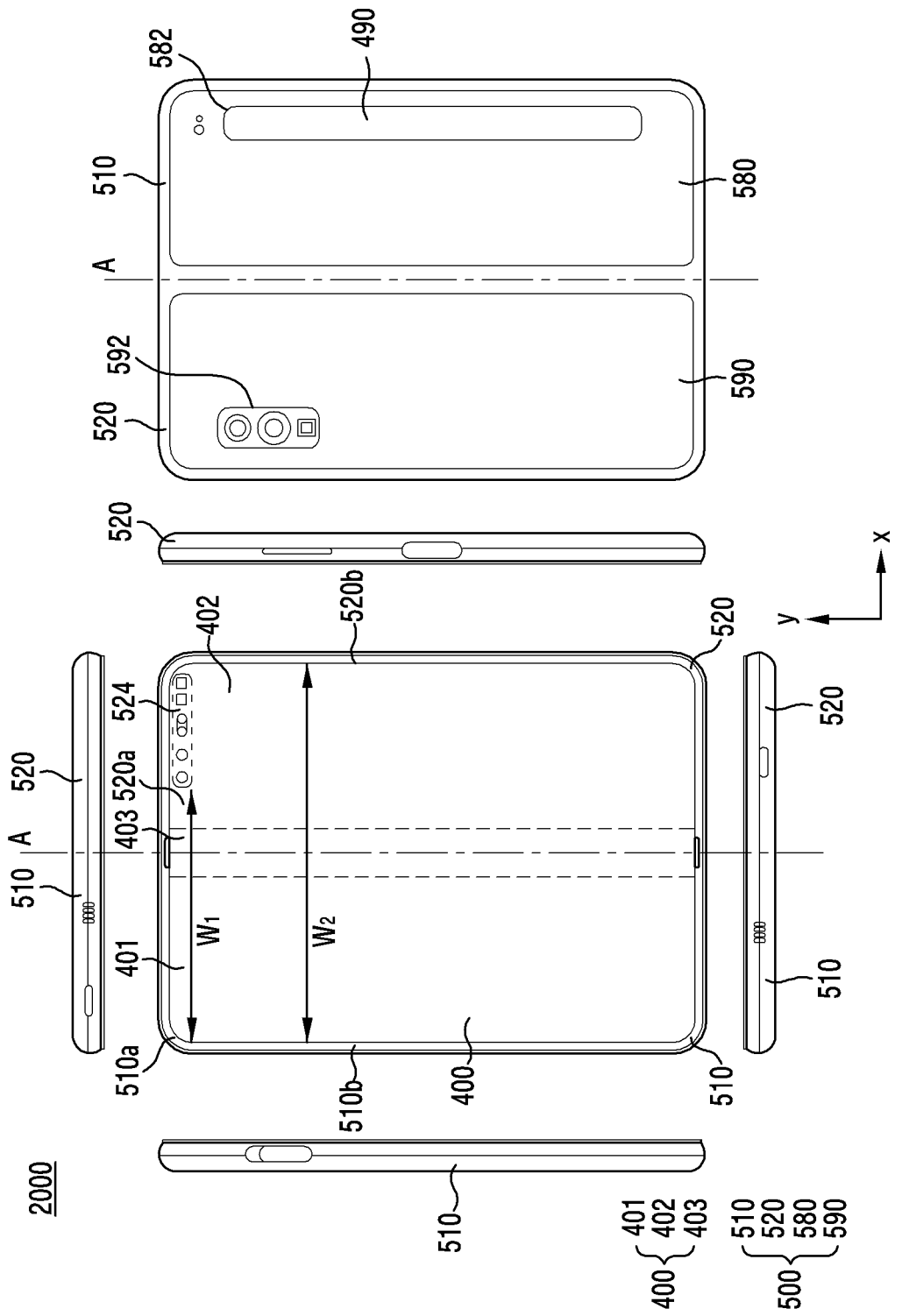
FIG. 5A is a view illustrating a flat state of an electronic device according to an embodiment of the disclosure.
Figure 5B:
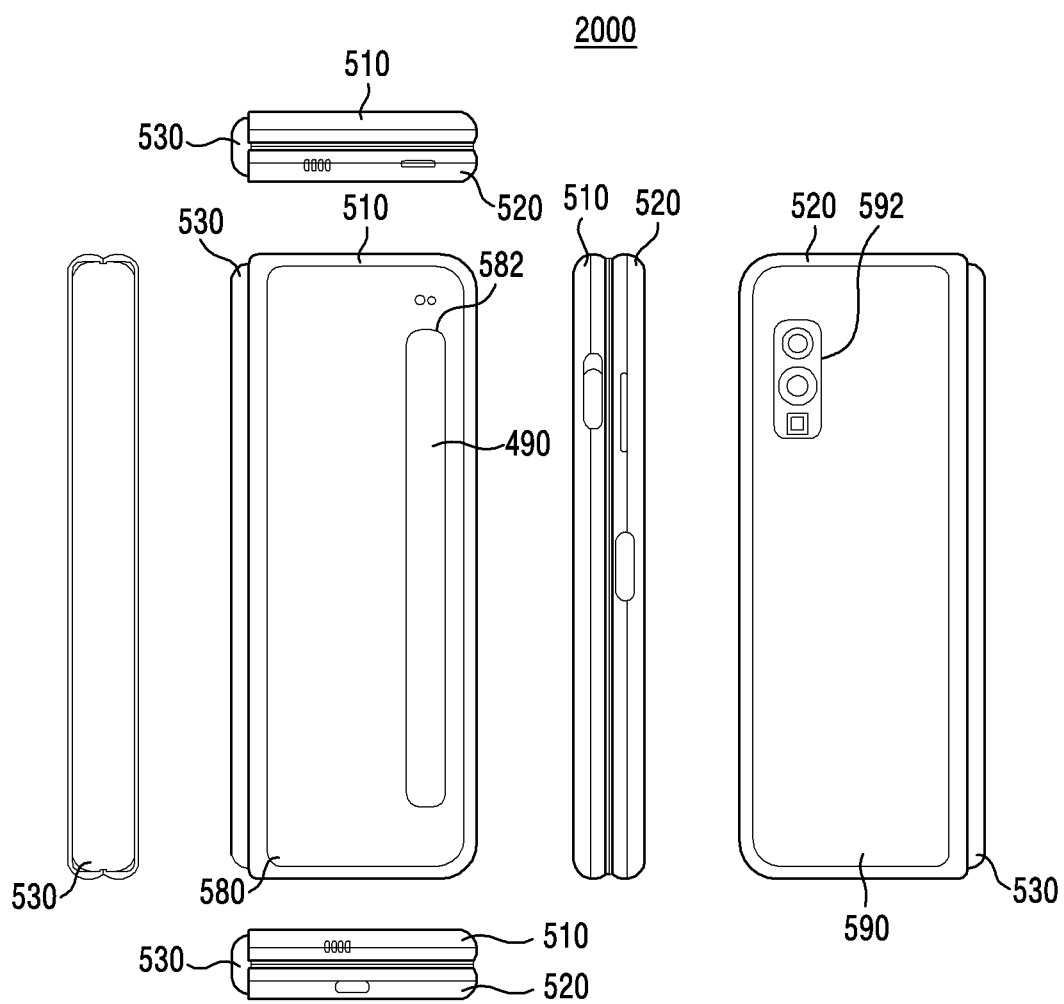
FIG. 5B is a view illustrating a folded state of the electronic device according to an embodiment of the disclosure.

FIG. 5A is a view illustrating a flat state of an electronic device 2000 according to an embodiment of the disclosure. FIG. 5B is a view illustrating a folded state of the electronic device 2000 according to an embodiment of the disclosure.

Referring to FIGS. 5A and 5B, in an embodiment, the electronic device 2000 (for example, the electronic device 1001 of FIG. 2) may include a foldable housing 500, a hinge cover 530 to cover a foldable portion of the foldable housing, and a flexible or foldable display 400 (hereinafter, referred to as a "display" 400) disposed in a space formed by the foldable housing 500. In the disclosure, a surface on which the display 400 is disposed is defined as a first surface or a front surface of the electronic device 2000. In addition, the opposite surface of the front surface is defined as a second surface or a rear surface of the electronic device 2000. In addition, a surface surrounding a space between the front surface and the rear surface is defined as a third surface or a side surface of the electronic device 2000.

In an embodiment, the foldable housing 500 may include a first housing structure 510, a second housing structure 520 including a sensor area 524, a first rear surface cover 580, and a second rear surface cover 590. The foldable housing 500 of the electronic device 2000 is not limited to the shape and coupling illustrated in FIGS. 5A and 5B, and may be implemented by a combination and/or coupling of other shapes or components. For example, in another embodiment, the first housing structure 510 and the first rear surface cover 580 may be integrally formed with each other, and the second housing structure 520 and the second rear surface cover 590 may be integrally formed with each other.

In the illustrated embodiment, the first housing structure 510 and the second housing structure 520 may be disposed on both sides with reference to a folding axis (A axis), and may have a substantially symmetrical shape with respect to the folding axis A. As will be described below, the first housing structure 510 and the second housing structure 520 may have an angle or a distance therebetween that is changed according to whether the electronic device 2000 is in a flat state, a folded state, or an intermediate state. In the illustrated embodiment, the second housing structure 520 additionally includes the sensor area 524 where various sensors are disposed, differently from the first housing structure 510, but may have a symmetrical shape on the other area.

In an embodiment, the first housing structure 510 and the second housing structure 520 may form a recess to accommodate the display 400 all together. In the illustrated embodiment, the recess may have two or more different widths in a direction perpendicular to the folding axis A due to the sensor area 524.

For example, the recess may have a first width w1 between a first portion 510*a* of the first housing structure 510 that is parallel to the folding axis A, and a first portion 520*a* of the second housing structure 520 that is formed on an edge of the sensor area 524. The recess may have a second width w2 formed by a second portion 510*b* of the first housing structure 510 and a second portion 520*b* of the second housing structure 520 that does not correspond to the sensor area 524 and is parallel to the folding axis A. In this case, the second width w2 may be longer than the first width w1. In other words, the first portion 510*a* of the first housing structure 510 and the first portion 520*a* of the second housing structure 520, which have an asymmetrical shape, may form the first width w1 of the recess, and the second portion 510*b* of the first housing structure 510 and the second portion 520*b* of the second housing structure 520, which have a symmetrical shape, may form the second width w2 of the recess. In an embodiment, the first portion 520*a* and the second portion 520*b* of the second housing structure 520 may have different distances from the folding axis A. The width of the recess is not limited to the illustrated example. In various embodiments, the recess may have a plurality of widths according to a shape of the sensor area 524 or portions of the first housing structure 510 and the second housing structure 520 that have an asymmetrical shape.

An optical sensor (for example, an optical sensor 610 of FIG. 5C) may be disposed on a lower portion (or a rear surface) of the display in an under display camera (UDC) method. When the optical sensor (for example, the optical sensor 610 of FIG. 5C) is disposed under the display, the first housing structure 510 and the second housing structure 520 may have a symmetrical shape.

In an embodiment, at least part of the first housing structure 510 and the second housing structure 520 may be formed with a metallic material or a nonmetallic material having stiffness of a size selected to support the display 400.

In an embodiment, the sensor area 524 may be formed to have a predetermined area adjacent to one corner of the second housing structure 520. However, the disposition, shape, and size of the sensor area 524 are not limited to the illustrated example. For example, in another embodiment, the sensor area 524 may be provided on another corner of the second housing structure 520 or a certain area between an upper end corner and a lower end corner. In an embodiment, components which are embedded in the electronic device 2000 to perform various functions may be exposed to the front surface of the electronic device 2000 through the sensor area 524 or one or more openings provided on the sensor area 524. In various embodiments, the components may include various types of sensors. The sensors may include, for example, at least one of a front-facing camera, a receiver, or a proximity sensor.

The first rear surface cover 580 may be disposed on one side of the folding axis on the rear surface of the electronic device, and for example, may have a substantially rectangular periphery and may have the periphery surrounded by the first housing structure 510. Similarly, the second rear surface cover 590 may be disposed on the other side of the folding axis on the rear surface of the electronic device, and may have the periphery surrounded by the second housing structure 520.

In the illustrated embodiment, the first rear surface cover 580 and the second rear surface cover 590 may have a substantially symmetrical shape with reference to the folding axis (A axis). However, the first rear surface cover 580 and the second rear surface cover 590 may not necessarily have the symmetrical shape, and in another embodiment, the electronic device 2000 may include the first rear surface cover 580 and the second rear surface cover 590 of various shapes. In still another embodiment, the first rear surface cover 580 may be integrally formed with the first housing structure 510, and the second rear surface cover 590 may be integrally formed with the second housing structure 520.

In an embodiment, the first rear surface cover 580, the second rear surface cover 590, the first housing structure 510, and the second housing structure 520 may form a space to have various components (for example, a printed circuit board or a battery) of the electronic device 2000 disposed therein. In an embodiment, one or more components may be disposed on the rear surface of the electronic device 2000 or may be visually exposed. For example, at least part of a sub display 490 may be visually exposed through a first rear surface area 582 of the first rear surface cover 580. In another embodiment, one or more components or a sensor may be visually exposed through a second rear surface area 592 of the second rear surface cover 590. In various embodiments, the sensor may include a proximity sensor and/or a rear-facing camera.

Referring to FIG. 5B, the hinge cover 530 may be disposed between the first housing structure 510 and the second housing structure 520, and may be configured to hide inner components (for example, a hinge structure). In an embodiment, the hinge cover 530 may be hidden by a portion of the first housing structure 510 and the second housing structure 520, or may be exposed to the outside, according to a state (a flat state or a folded state) of the electronic device 2000.

For example, when the electronic device 2000 is in the flat state as shown in FIG. 5A, the hinge cover 530 may be hidden by the first housing structure 510 and the second housing structure 520 and may not be exposed. For example, when the electronic device 2000 is in the folded state (for example, a fully folded state) as shown in FIG. 5B, the hinge cover 530 may be exposed to the outside between the first housing structure 510 and the second housing structure 520. For example, in an intermediate state in which the first housing structure 510 and the second housing structure 520 are folded with a certain angle, the hinge cover 530 may be exposed to the outside in part between the first housing structure 510 and the second housing structure 520. However, in this case, the exposed area may be smaller than in the fully folded state. In an embodiment, the hinge cover 530 may include a curved surface.

The display 400 may be disposed on the space formed by the foldable housing 500. For example, the display 400 may be seated on the recess formed by the foldable housing 500, and may form most of the front surface of the electronic device 2000.

Accordingly, the front surface of the electronic device 2000 may include the display 400, and some areas of the first housing structure 510 adjacent to the display 400 and some areas of the second housing structure 520. In addition, the rear surface of the electronic device 2000 may include the first rear surface cover 580, some areas of the first housing structure 510 that are adjacent to the first rear surface cover 580, the second rear surface cover 590, and some areas of the second housing structure 520 that are adjacent to the second rear surface cover 590.

The display 400 may refer to a display that has at least some areas deformable to a flat surface or a curved surface.

In an embodiment, the display 400 may include a folding area 403, a first area 401 disposed on one side (the left of the folding area 403 show in FIG. 5A) with reference to the folding area 403, and a second area 402 disposed on the other side (the right of the folding area 403 shown in FIG. 5A). The display 400 may include a polarizing film (or a polarizing layer), a window (for example, ultra-thin glass (UTG) or polymer window), and/or an optical compensation film (OCF).

The divided areas of the display 400 shown in FIG. 5A are examples and the display 400 may be divided into a plurality of areas (for example, four or more areas or two areas) according to a structure or a function of the display 400. For example, in the embodiment illustrated in 5A, the display 400 may be divided into areas by the folding area 403 extended in parallel with the y-axis or the folding axis (A axis), but in another embodiment, the display 400 may be divided into areas with reference to another folding area (for example, a folding area parallel to the x-axis) or another folding axis (for example, a folding axis parallel to the x-axis).

The first area 401 and the second area 402 may have a substantially symmetrical shape with reference to the folding area 403. However, the second area 402 may include a notch that is cut according to the presence of the sensor area 524, differently from the first area 401, but may have a symmetrical shape with the first area 401 on the other area. In other words, the first area 401 and the second area 402 may include portions that have a symmetrical shape and portions that have an asymmetrical shape.

Hereinafter, operations of the first housing structure 510 and the second housing structure 520 and respective areas of the display 400 according to a state (for example, a flat state or a folded state) of the electronic device 2000 will be described.

In an embodiment, when the electronic device 2000 is in the flat state (for example, FIG. 5A), the first housing structure 510 and the second housing structure 520 may form the angle of 180° and may be disposed to face in the same direction. A surface of the first area 401 of the display 400 and a surface of the second area 402 may form the angle of 180° with each other, and may face in the same direction (for example, the front surface direction of the electronic device). The folding area 403 may form the same plane as the first area 401 and the second area 402.

In an embodiment, when the electronic device 2000 is in the folded state (for example, FIG. 5B), the first housing structure 510 and the second housing structure 520 may be disposed to face each other. The surface of the first area 401 of the display 400 and the surface of the second area 402 may face each other while forming a small angle (for example, between 0° and 10°) with each other. At least part of the folding area 403 may have a curved surface having a predetermined curvature.

In an embodiment, when the electronic device 2000 is in the intermediate state (for example, FIG. 5B), the first housing structure 510 and the second housing structure 520 may be disposed with a certain angle. The surface of the first area 401 of the display 400 and the surface of the second area 402 may form an angle that is larger than in the folded state and is smaller than in the flat state. At least part of the folding area 403 may have a curved surface having a predetermined curvature, and the curvature in this state may be smaller than in the folded state.

Figure 5C:
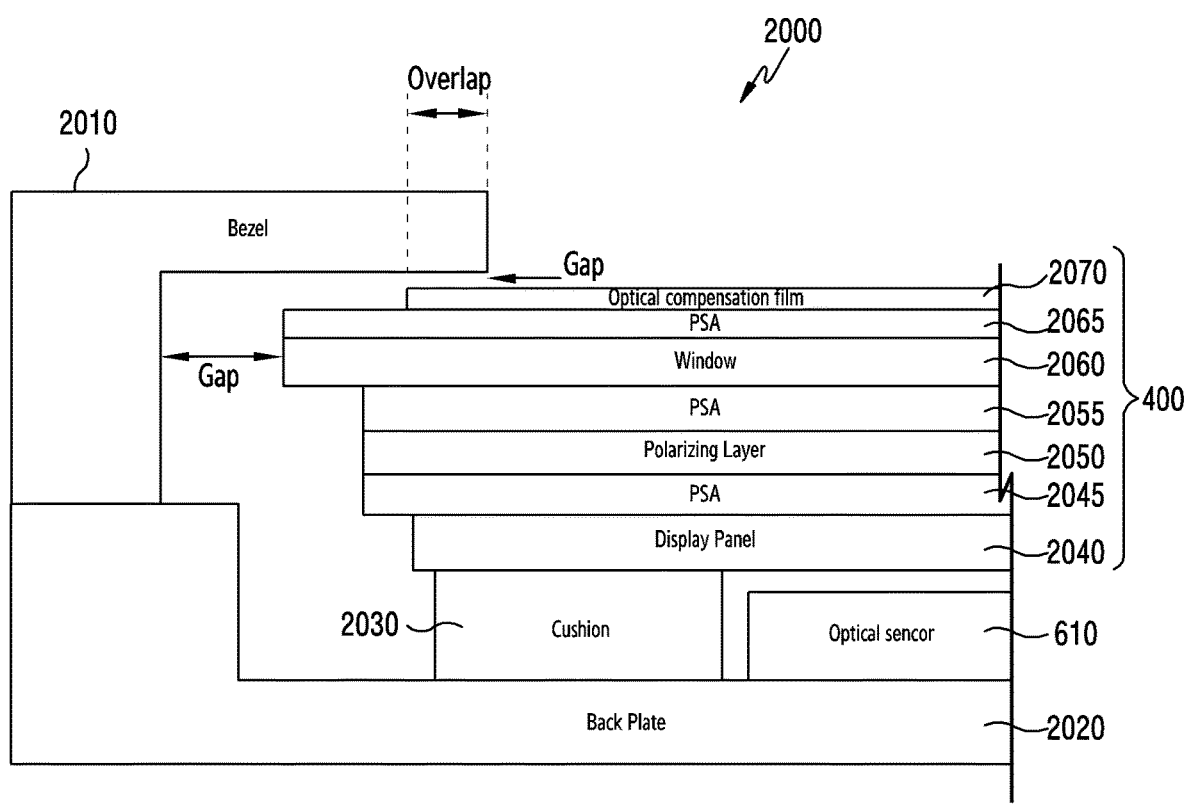
FIG. 5C is a cross-sectional view of the electronic device according to an embodiment of the disclosure.
Figure 5D:
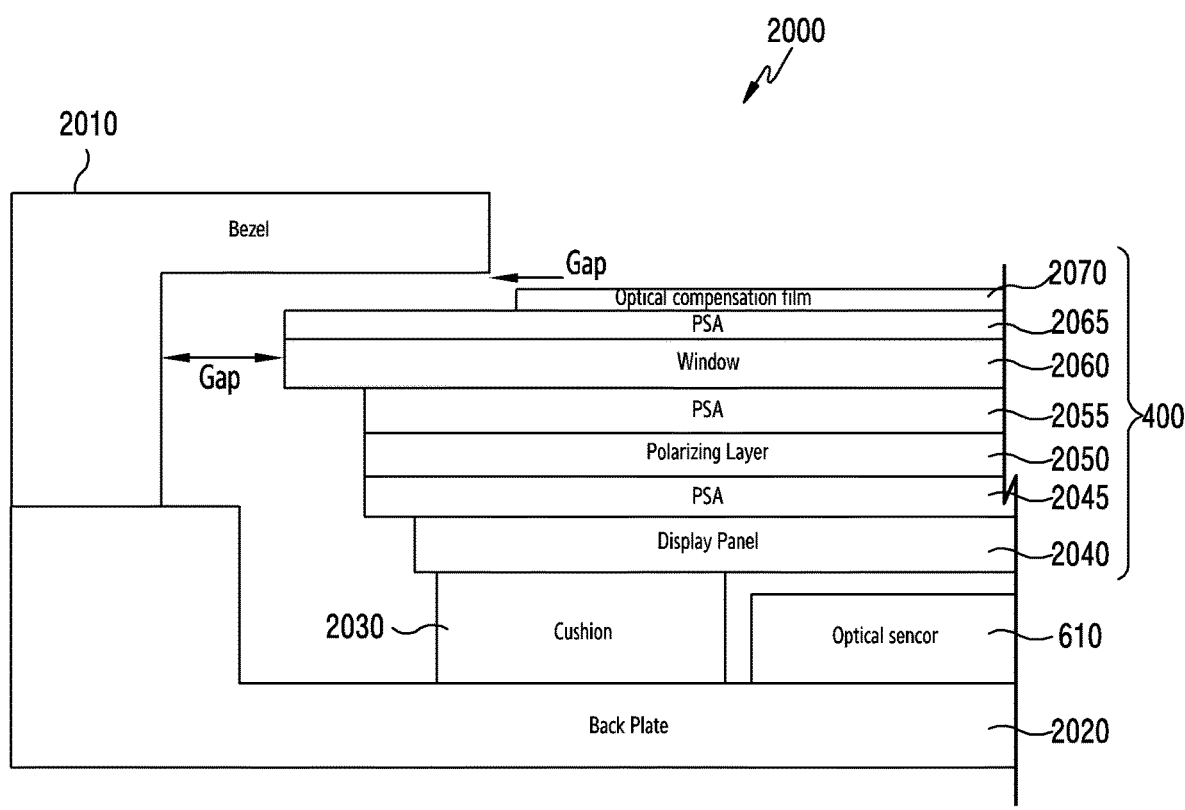
FIG. 5D is a cross-sectional view of the electronic device according to an embodiment of the disclosure.
Figure 5E:
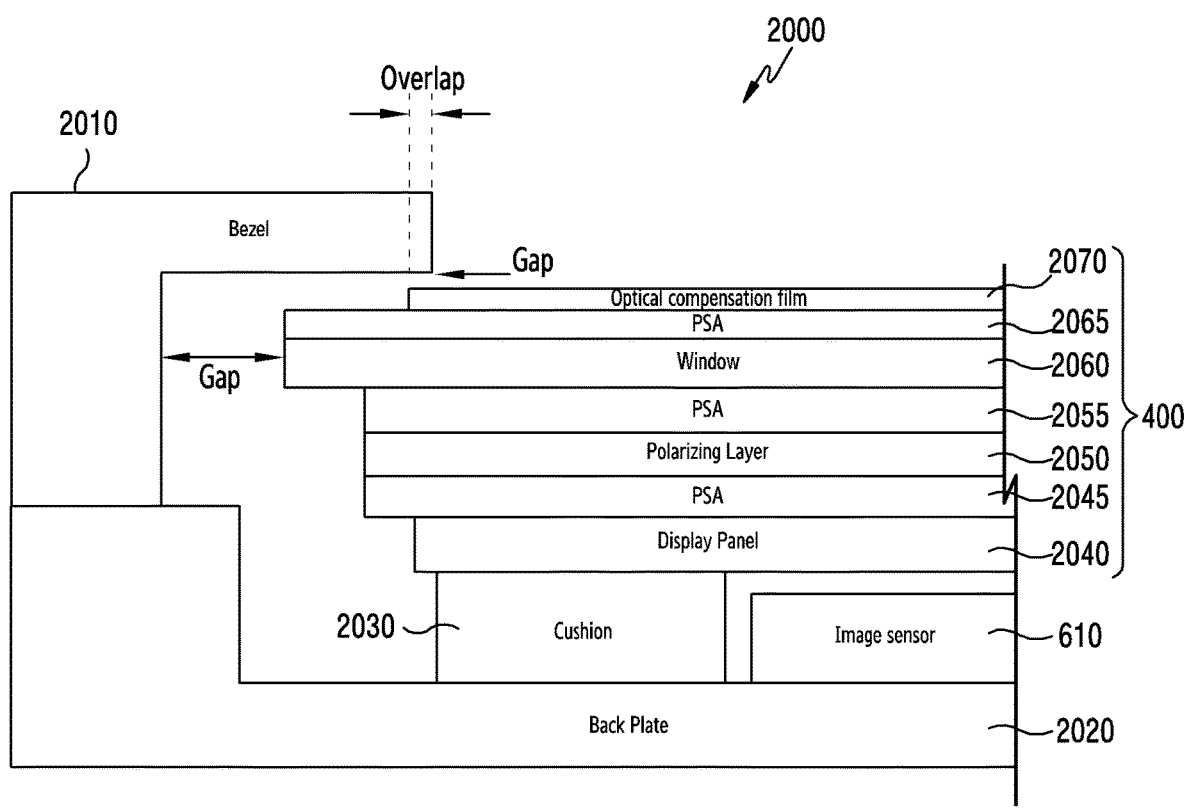
FIG. 5E is a cross-sectional view of the electronic device according to an embodiment of the disclosure.

FIGS. 5C, 5D, and 5E are cross-sectional views of an electronic device 2000 according to various embodiments of the disclosure.

Referring to FIGS. 5C and 5D, the electronic device 2000 according to various embodiments of the disclosure may include a display 400, an optical sensor 610 (for example, the camera module 105 of FIG. 3A, the camera module 1080 of FIGS. 2 and 4) which is disposed on a lower portion (or a rear surface) of the display 400, a bezel 2010 which is formed to enclose a part of a first surface (or a front surface) and a second surface (or a side surface) of the display 400, and a back plate 2020 (for example, a bracket or a support structure) which is formed to support a third surface (or a rear surface) of the display 400. The optical sensor 610 may be disposed on a lower portion (or a rear surface) of the display 400 in an under display camera (UDC) method. A cushion 2030 may be disposed between the lower portion of the display port (DP) and the back plate 2020 to absorb an impact caused by pressing by the display 400. The cushion 2030 may be disposed on a portion other than the portion of the optical sensor 610. The cushion 2030 may be disposed to correspond to a lower portion of some peripheries of the display 400 or a lower portion of all peripheries of the display 400.

FIGS. 5C and 5D illustrate that the bezel 2010 and the back plate 2020 are separate components, but this should not be considered as limiting. The bezel 2010 and the back plate 2020 may be integrated into one component. The bezel 2010 and the back plate 2020 may be formed by plastic, ceramic, a polymer, metal (for example, aluminum, stainless steel (STS), or magnesium), or a combination of at least two of the above-mentioned materials.

The electronic device 2000 may be folded or unfolded in an in-folding method, and the display may go into a sleep state according to folding or unfolding. FIG. 5C illustrates that the electronic device 2000 is in a folded state in the in-folding method. FIG. 5D illustrates that the electronic device 2000 is in a flat state. To the contrary, the electronic device 2000 may be folded or unfolded in an out-folding method. In this case, FIG. 5C illustrates that the electronic device 2000 is in a flat state. FIG. 5D illustrates that the electronic device 2000 is in a folded state in the out-folding method. As shown in FIG. 5E, even when the electronic device 2000 is unfolded in the in-folding method, a part of an optical compensation film 2070 may overlap the bezel.

The display 400 may include a display panel 2040, a polarizing layer 2050 (a polarizing film), a window 2060 (for example, ultra-thin glass (UTG) or polymer), and an optical compensation film (OCF) 2070.

A first adhesive member (a pressure sensitive adhesive (PSA)) 2045 may be disposed between an upper surface of the display panel 2040 and a lower surface of the polarizing layer 2050 to attach the display panel 2040 and the polarizing layer 2050. A second adhesive member (PSA) 2055 may be disposed between an upper surface of the polarizing layer 2050 and a lower surface of the window 2060 to attach the polarizing layer 2050 and the window 2060. A third adhesive member (PSA) 2065 may be disposed between an upper surface of the window 2060 and a lower surface of the optical compensation film 2070 to attach the window 2060 and the optical compensation film 2070.

The optical compensation film 2070 may be disposed to correspond to some surfaces of the polarizing layer 2050 and the window 2060. It is illustrated in FIGS. 5C and 5D that one window 2060 is disposed. However, this should not be considered as limiting, and a plurality of windows may be disposed. The plurality of windows may apply ultra-thin glass (UTG) or polymer.

The polarizing layer 2050 may be disposed on an upper portion of the display panel 2040. The window 2060 may be disposed over the polarizing layer 2050. The optical compensation film 2070 may be disposed over the window 2060. The optical compensation film 2070 may have a function of a protection film for protecting the window 2060, and a function of a phase difference film for preventing rainbow stain caused by application of the polarizing layer 2050.

The electronic device 2000 may be a foldable phone (for example, the electronic device 2000 of FIGS. 5A and 5B). The display 400 may apply a flexible or foldable display.

A gap may be formed between a side surface of the display 400 and a side surface of the bezel 2010, such that the side surface of the display 400 does not come into contact with the side surface of the bezel 2010 when the electronic device 2000 is folded, and the respective layers of the display 400 are not broken. In addition, a gap may be formed to prevent an upper surface of the optical compensation film 2070 and a lower surface of an upper side of the bezel 2010 from coming into contact with each other. In an embodiment, the upper surface of the optical compensation film 2070 and the lower surface of the upper side of the bezel 2010 may overlap each other by a predetermined width as shown in FIG. 5C. In an embodiment, the upper surface of the optical compensation film 2070 and the lower surface of the upper side of the bezel 2010 may be formed not to overlap each other as shown in FIG. 5D.

Figure 6:
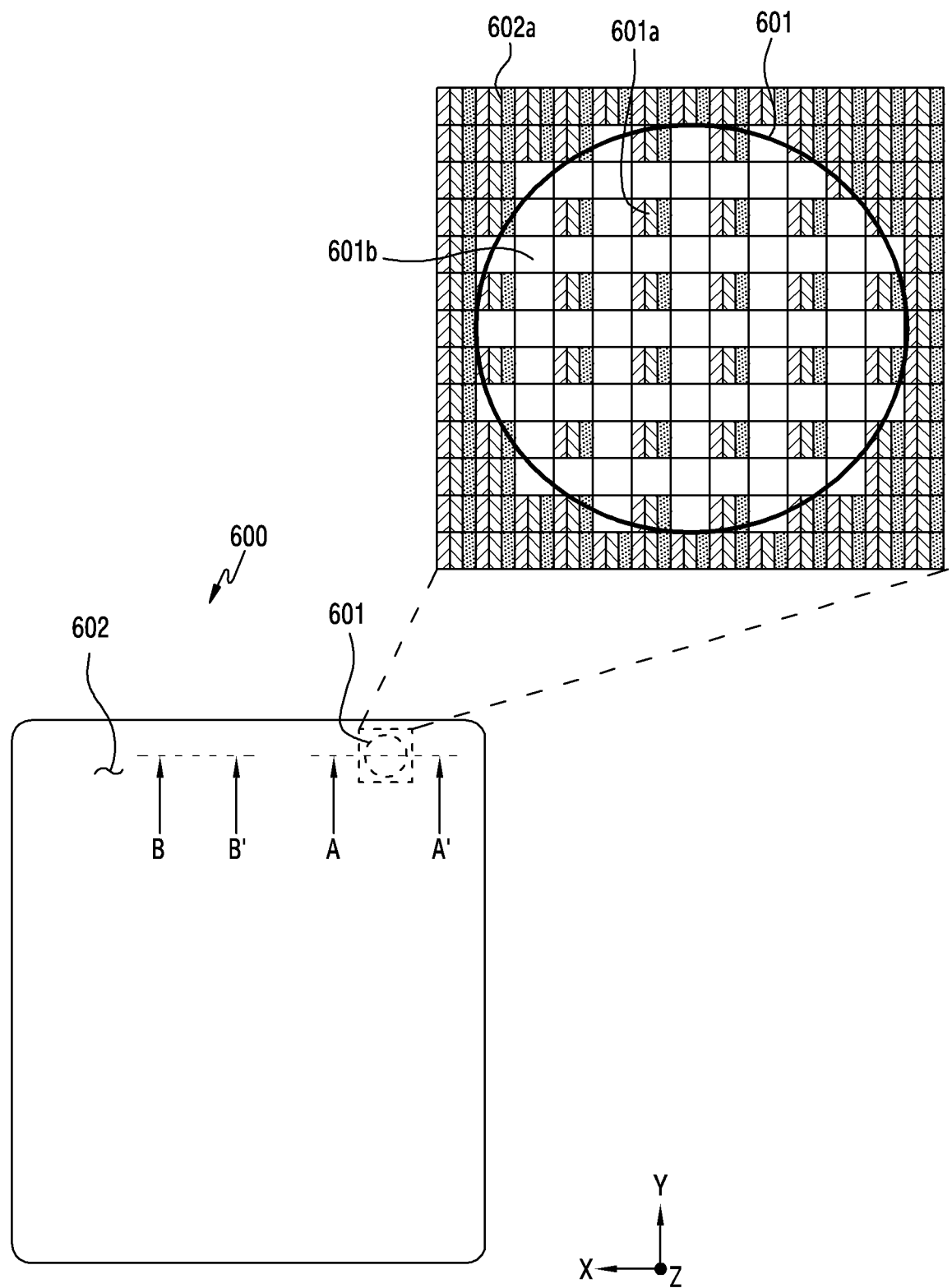
FIG. 6 is a view illustrating a display area and an under display camera (UDC) area of an electronic device, and arrangements of pixels of the UDC area according to an embodiment of the disclosure.
Figure 7A:
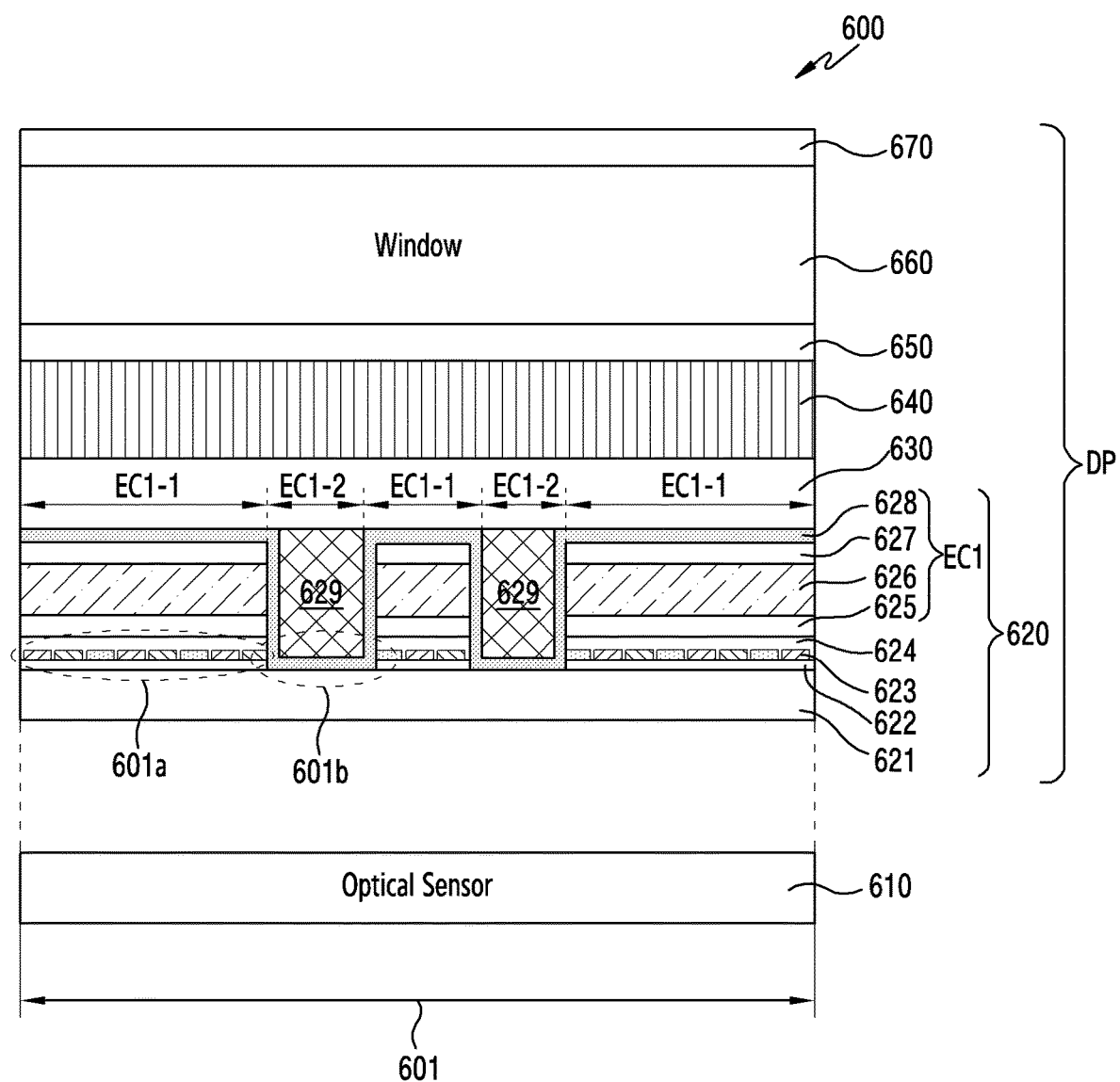
FIG. 7A is a view illustrating a cross section of the electronic device, taken on line A-A' of FIG. 6, according to an embodiment of the disclosure.
Figure 7B:
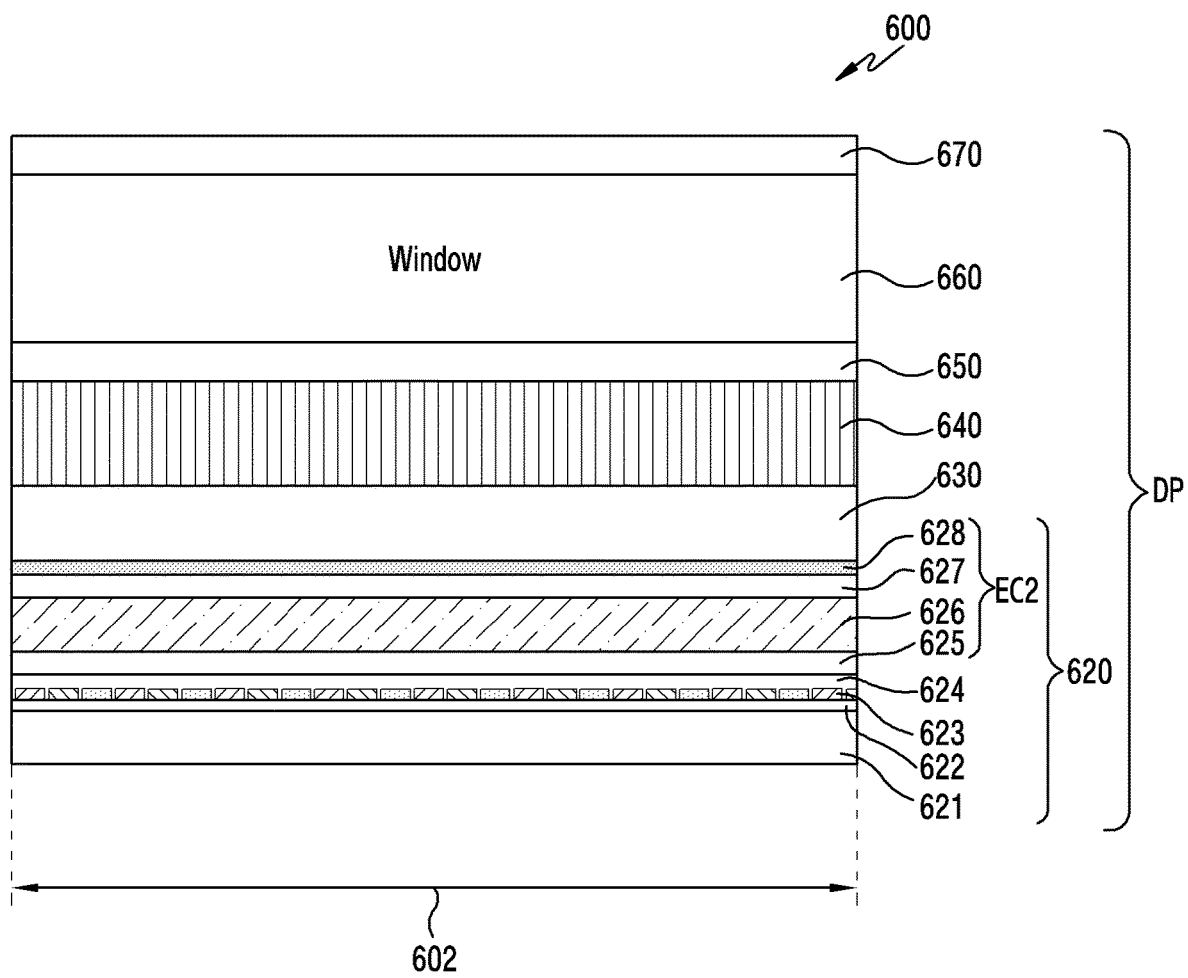
FIG. 7B is a view illustrating a cross section of the electronic device, taken on line B-B' of FIG. 6, according to an embodiment of the disclosure.

FIG. 6 is a view illustrating a display area and an under display camera (UDC) area of an electronic device 600, and a pixel arrangement of the UDC area according to an embodiment of the disclosure. FIG. 7A is a view illustrating a cross section of the electronic device 600, taken on line A-A' of FIG. 6, according to an embodiment of the disclosure. FIG. 7B is a view illustrating a cross section of the electronic device 600, taken on line B-B' of FIG. 6, according to an embodiment of the disclosure.

Referring to FIGS. 6, 7A, and 7B, the electronic device 600 according to various embodiments of the disclosure may include a display (DP) (for example, the display 10 of FIG. 1, the display device 1060 of FIG. 2, or the display 400 of FIG. 5A), and an optical sensor 610. According to an embodiment, as the optical sensor 610, the camera module 1080 of FIG. 2, the camera module 105 of FIG. 3A, or the camera module 1080 of FIG. 4 may be applied.

The display (DP) may include a display panel 620 (for example, the display panel 2040 of FIG. 5C), a touch panel 630 (or a touch pattern) (for example, the touch circuitry 50 of FIG. 1), a polarizing film 640 (for example, the polarizing layer 2050 of FIG. 5C), an adhesive member 650 (for example, the second adhesive member 2055 of FIG. 5C), a window 660 (for example, ultra-thin glass (UTG) or polymer) (for example, the window 2060 of FIG. 5C), and a protection film 670 (for example, the optical compensation film 2070 of FIG. 5C). It is illustrated in FIG. 6 that one window 660 is disposed. However, this should not be considered as limiting, and a plurality of windows may be disposed.

The display panel 620 may be an organic light emitting diode (OLED) panel, a liquid crystal display (LCD), or a quantum dot light-emitting diode (QLED) panel. The display panel 620 may include a plurality of pixels for displaying an image, and one pixel may include a plurality of sub pixels. In an embodiment, one pixel may include three color sub pixels, that is, a red sub pixel, a green sub pixel, and a blue sub pixel. In an embodiment, one pixel may include four color sub pixels, that is, a red sub pixel, a green sub pixel, a blue sub pixel, and a white sub pixel. In an embodiment, one pixel may be configured in a red, green, blue and green (RGBG) pentile method, including one red sub pixel, two green sub pixels, and one blue sub pixel.

According to various embodiments, the display (DP) may include a control circuit (not shown). According to an embodiment, the control circuit may include a flexible printed circuit board (FPCB) to electrically connect a main printed circuit board and the display panel 620, and a display driver IC (DDI) (for example, the display driver IC 30 of FIG. 1) mounted on the FPCB.

An image may be displayed on the whole front surface (for example, a surface on which a screen is displayed) of the display (DP) except for a bezel. The front surface (for example, the surface on which the screen is displayed) of the display (DP) may include an under display camera area 601 and a display area 602. In the disclosure, the under display camera area 601 may be a sensor area. The optical sensor 610 (for example, a camera module, a fingerprint sensor, an image sensor) may be disposed on a lower portion (for example, a lower portion in the x-axis direction) of the display (DP) to correspond to the under display camera area 601. The other portion of the front surface (for example, the surface on which the screen is displayed) of the display (DP) except for the under display camera area 601 corresponding to the optical sensor 610 may be the display area 602. It is illustrated in FIG. 6 that the under display camera area 601 is disposed to correspond to a right upper end (for example, a right side in the x-axis direction and an upper end in the y-axis direction) of the display (DP). However, this should not be considered as limiting, and the under display camera area 601 may be disposed to correspond to a certain position on the whole surface of the display (DP). It is illustrated in FIGS. 6 and 7A that the electronic device 600 includes one under display camera area 601 and one optical sensor 610. However, this should not be considered as limiting, and the electronic device 600 may include a plurality of under display camera areas and a plurality of camera modules.

The optical sensor 610 may be disposed on a lower portion of the display panel 620 in an under display camera (UDC) method. One optical sensor 610 may be disposed on the lower portion of the display panel 620. Pixels 601a may be disposed even in the under display camera area 601 in which the optical sensor 610 is disposed, thereby displaying an image.

Since the optical sensor 610 is disposed on the lower portion of the display panel 620 in the under display camera (UDC) method, there may be a need for guaranteeing transmissivity by considering quality of a photographed image. To achieve this, the number of first pixels 601a disposed in the under display camera area 601 may be smaller than the number of second pixels 602a disposed in the display area 602. The first pixels 601a may be disposed on a portion of the whole area of the under display camera area 601, and a non-pixel area 601b (or a transmission area) without pixels may be disposed on the other portion. It is illustrated in FIG. 6 that the first pixels 601a and the non-pixel areas 601b (or the transmission areas) of the under display camera area 601 are regularly disposed. However, this should not be considered as limiting, and the first pixels 601a and the non-pixel areas 601b (or transmission areas) may be irregularly disposed in the under display camera area 601.

It is illustrated in FIG. 6 that the under display camera area 601 has a circular shape by way of an example. However, this should not be considered as limiting, and the under display camera area 601 may have an oval shape or a polygonal shape. A small number of first pixels 601a may be disposed in the under display camera area 601, compared to the number of second pixels 602a disposed in the display area 602, such that the display area 602 and the under display camera area 601 display different resolutions. In an embodiment, the under display camera area 601 may display a lower resolution than the display area 602.

Herein, a plurality of under display camera areas 601 may be disposed. The plurality of under display camera areas 601 may be disposed on a plurality of certain positions on the whole surface of the display (DP).

As shown in FIGS. 7A and 7B, the display panel 620 may include a substrate 621 (for example, a glass substrate or a polymer (for example, polyimide (PI)) substrate), a drive circuit layer 622 (for example, a TFT layer), a pixel layer 623, a cathode 624, and an encapsulation portion EC1, EC2.

The encapsulation portion EC1, EC2 may be formed to correspond to the under display camera area 601 and the display area 602. The encapsulation portion EC1, EC2 may be formed in a stacked structure of a plurality of inorganic layers 625, 627, 628 and one or more organic layers 626.

The first encapsulation portion EC1 may encapsulate the under display camera area 601. The second encapsulation portion EC2 may encapsulate the display area 602. The first encapsulation portion EC1 of the under display camera area 601 and the second encapsulation portion EC2 of the display area 602 may include different configurations. The first encapsulation portion and the second encapsulation portion may have different stacked structures of layers.

The first encapsulation portion EC1 for encapsulating the under display camera area 601 may include a pixel area encapsulation portion EC1-1 for encapsulating a pixel area in which the first pixels 601a are disposed, and a non-pixel area encapsulation portion EC1-2 for encapsulating the non-pixel area 601b (or the transmission area). The pixel area encapsulation portion EC1-1 and the non-pixel area encapsulation portion EC1-2 may be disposed in different forms. The pixel area encapsulation portion EC1-1 and the non-pixel area encapsulation portion EC1-2 may include different configurations. The pixel area encapsulation portion EC1-1 and the non-pixel area encapsulation portion EC1-2 may have different stacked structures of layers.

The pixel area encapsulation portion EC1-1 may include a first inorganic layer 625, an organic layer 626, a second inorganic layer 627, and a third inorganic layer 628. An organic layer (not shown) may further be disposed between the second inorganic layer 627 and the third inorganic layer 628. The pixel area encapsulation portion EC1-1 may include the same configuration as the second encapsulation portion EC2 for encapsulating the display area 602.

The organic layer 626 among the first inorganic layer 625, the second inorganic layer 627, the third inorganic layer 628, the organic layer 626 of the pixel area encapsulation portion EC1-1 and the second encapsulation portion EC2 may be thickest. The first inorganic layer 625, the second inorganic layer 627, and the third inorganic layer 628 of the pixel area encapsulation portion EC1-1 and the second encapsulation portion EC2 may be formed with the same thickness. In an embodiment, the first inorganic layer 625, the second inorganic layer 627, and the third inorganic layer 628 may have different thicknesses. In an embodiment, an organic layer (not shown) may further be disposed between the second inorganic layer 627 and the third inorganic layer 628.

In an embodiment, the first inorganic layer 625, the second inorganic layer 627, and the third inorganic layer 628 may include a silicon oxide, a silicon nitride, a silicon carbide, an aluminum oxide, a tantalum oxide, a hafnium oxide, a zirconium oxide, a titanium oxide. The first inorganic layer 625, the second inorganic layer 627, and the third inorganic layer 628 may be formed by chemical vapor deposition (CVD).

The first inorganic layer 625 of the pixel area encapsulation portion EC1-1 may be disposed over the cathode 624. The organic layer 626 of the pixel area encapsulation portion EC1-1 may be disposed over the first inorganic layer 625. The second inorganic layer 627 of the pixel area encapsulation portion EC1-1 may be disposed over the organic layer 626. In an embodiment, the organic layer 626 may include a cured polymeric material such as polyacrylate, polyimide, polycarbonate, epoxy, polyethylene. The cured polymeric material may be formed by the crosslinking reaction of a monomer.

The third inorganic layer 628 of the pixel area encapsulation portion EC1-1 may be disposed over the second inorganic layer 627.

The non-pixel area encapsulation portion EC1-2 may include the third inorganic layer 628 and an index matching portion 629. In an embodiment, an organic layer (not shown) may further be disposed between the second inorganic layer 627 and the third inorganic layer 628. A plurality of organic layers and a plurality of inorganic layer may be disposed alternately, and the third inorganic layer 628 may be disposed on an uppermost end.

In order to guarantee transmissivity of the non-pixel area 601b (or transmission area), the first inorganic layer 625, the organic layer 626, and the second inorganic layer 627 may be removed, and the third inorganic layer 628 may be formed along a profile from which the first inorganic layer 625, the organic layer 626, and the second inorganic layer 627 are removed. The third inorganic layer 628 may be formed to cover sidewalls of the first inorganic layer 625, the organic layer 626, and the second inorganic layer 627, and to prevent expansion of the organic layer 626. Moisture and oxygen may be prevented from permeating the pixels and the inorganic layer 626 by the third inorganic layer 628.

A step generated by removal of the first inorganic layer 625, the organic layer 626, and the second inorganic layer 627 may be compensated for by the index matching portion 629. The index matching portion 629 may be formed over the third inorganic layer 628, such that the upper surface of the non-pixel area encapsulation portion EC1-2 is smoothened. An upper surface of the second encapsulation portion EC2, an upper surface of the pixel area encapsulation portion EC1-1 and the upper surface of the non-pixel area encapsulation portion EC1-2 may be formed with the same height, thereby being smoothened. A corner formed by the step caused by removal of the first inorganic layer 625, the organic layer 626, and the second inorganic layer 627 may have a curve or may have a trapezoid shape, an inverted trapezoid shape or a polygonal shape. In an embodiment, the index matching portion 629 may be disposed on both the pixel area encapsulation portion EC1-1 and the non-pixel area encapsulation portion EC1-2.

The second encapsulation portion EC2 for encapsulating the display area 602 may be formed on the front surface except for the under display camera area 601. The second encapsulation portion EC2 may include the first inorganic layer 625, the organic layer 626, the second inorganic layer 627, and the third inorganic layer 628. The first inorganic layer 625 may be formed over the cathode 624. The organic layer 626 may be formed over the first inorganic layer 625. The second inorganic layer 627 may be formed over the organic layer 626. The third inorganic layer 628 may be formed over the second inorganic layer 627.

The touch panel 630 (or touch pattern) (for example, the touch circuitry 50 of FIG. 1) may be disposed over the first encapsulation portion EC1 and the second encapsulation portion EC2.

According to an embodiment, the display (DP) may operate as a touch display of an in-cell method or an on-cell method or an add on method according to a disposition position of the touch panel 630. When the touch panel 630 operates as the touch display of the in-cell method or the on-cell method, the control circuit may include a touch display driver IC (TDDI).

In an embodiment, the display (DP) may further include a fingerprint sensor (for example, the sensor module 76 of FIG. 1, the sensor module 1076 of FIG. 2) disposed on the periphery of the control circuit. According to an embodiment, the fingerprint sensor may include an ultrasonic or optical fingerprint sensor (for example, the sensor module 76 of FIG. 1, the sensor module 1076 of FIG. 2) that recognizes a fingerprint of a finger which touches an outer surface of a front surface cover or approaches through a hole formed on some of the components of the display (DP) at least in part.

The polarizing film 640 may be disposed over the touch panel 630. The polarizing film 640 may polarize incident light and may output the light. The polarizing film 640 may polarize light entering the display panel 620, thereby preventing degradation of display quality caused by light reflection. According to an embodiment, the display panel 620 and the polarizing film 640 may be integrally formed. According to an embodiment, a color filter formed by red (R), green (G), blue (B) pigments having a polarizing function may be disposed on a pixel disposed in the display panel 620, and the polarizing film 640 may be deleted.

The window 660 (for example, ultra-thin glass (UTG) or polymer) may be disposed over the polarizing film 640. The adhesive member 650 may be disposed between the polarizing film 640 and the window 660 to bond the polarizing film 640 and the window 660. In an embodiment, the adhesive member 650 may include an optical clear adhesive (OCA), a pressure sensitive adhesive (PSA), a thermoresponsive adhesive, a normal adhesive or a double-sided tape.

The protection film 670 may be disposed over the window 660. The protection film 670 may be disposed to correspond to a part of the window 660. In an embodiment, the protection film 670 may include an optical compensation film.

In an embodiment, the protection film 670 may be disposed over the polarizing film 640 without the window 660. In an embodiment, the window 660 and the protection film 670 may be disposed in sequence on the display panel 620 without the polarizing film 640.

In an embodiment, an adhesive member may be formed between the display panel 620 and the touch panel 630 to bond the display panel 620 and the touch panel 630. In an embodiment, an adhesive member may be formed between the touch panel 630 and the polarizing film 640 to bond the touch panel 630 and the polarizing film 640. In an embodiment, an adhesive member may be formed between the window 660 and the protection film 670 to bond the window 660 and the protection film 670.

In an embodiment, the electronic device 600 may be a foldable phone. In an embodiment, the electronic device 600 may be a non-foldable phone.

Figure 8A:
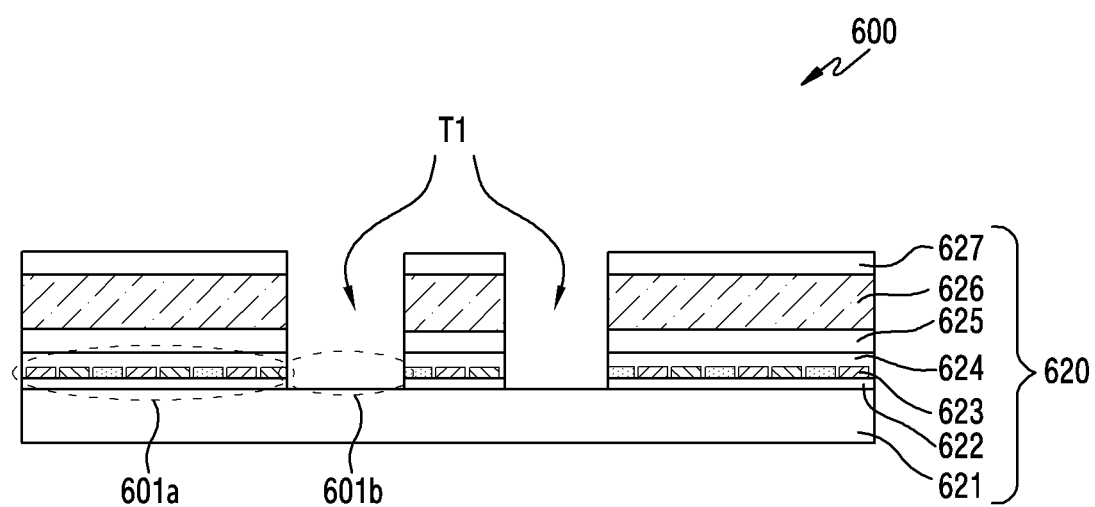
FIG. 8A is a view illustrating a manufacturing method of an electronic device, whereby a trench is formed in a non-pixel area (or a transmission area) according to an embodiment of the disclosure.

FIG. 8A is a view illustrating a method for manufacturing the electronic device 600, whereby a trench T1 is formed in the non-pixel area 601b (or transmission area) according to an embodiment of the disclosure.

Referring to FIGS. 6, 7A, 7B, and 8A, the drive circuit layer 622 (for example, the TFT layer), the pixel layer 623, and the cathode 624 may be formed over the substrate 621 of the display area 602. The drive circuit layer 622 (for example, the TFT layer), the pixel layer 623, and the cathode 624 may not be formed in the under display camera area 601.

Next, in order to encapsulate pixels of the under display camera area 601 and the display area 602, the first inorganic layer 625, the organic layer 626, and the second inorganic layer 627 may be disposed over the cathode 624 in sequence.

In an embodiment, a monomer composition may be provided on an upper surface of the first inorganic layer 625, such that the organic layer 626 is smoothly formed on an upper portion of the first inorganic layer 625. The monomer composition may include a curable monomer. The curable monomer may include at least one curable functional group. The curable functional group may include a vinyl group, a (meth) acrylate group, an epoxy group, etc. The curable monomer may include ethylene glycol di(meth)acrylate, hexanediol di(meth)acrylate, heptanediol di(meth)acrylate, octanediol di(meth)acrylate, nonanediol di(meth)acrylate, decanediol di(meth)acrylate, tri-ethylpropane tri(meth)acrylate, pentaerythritol tri(meth) acrylate, pentaerythritol tetra (meth) acrylate, di-pentaerythritol tri(meth) acrylate, di-pentaerythritol tetra(meth) acrylate, di-pentaerythritol penta (meth) acrylate, di-pentaerythritol hexa (meth) acrylate. The monomer composition may further include an initiator such as a photoinitiator. The monomer composition may be provided on the upper surface of the first inorganic layer 625 by inkjet printing, screen printing.

The second inorganic layer 627 may be formed over the organic layer 626. The second inorganic layer 627 may include the same material as the first inorganic layer 625 and may be formed in the same process.

Next, in order to guarantee transmissivity of the non-pixel area 601b (or transmission area) where a driver circuit and pixels are not formed in the under display camera area 601, the first inorganic layer 625, the organic layer 626, and the second inorganic layer 627 may be removed, and a trench T1 may be formed. Herein, the trench T1 may be formed to expose an upper surface of the substrate 621. Sidewall surfaces of the drive circuit layer 622 (for example, the TFT layer), the pixel layer 623, and the cathode 624 may be exposed by the trench T1. In addition, sidewall surfaces of the first inorganic layer 625, the organic layer 626, and the second inorganic layer 627 may be exposed by the trench T1.

Figure 8B:
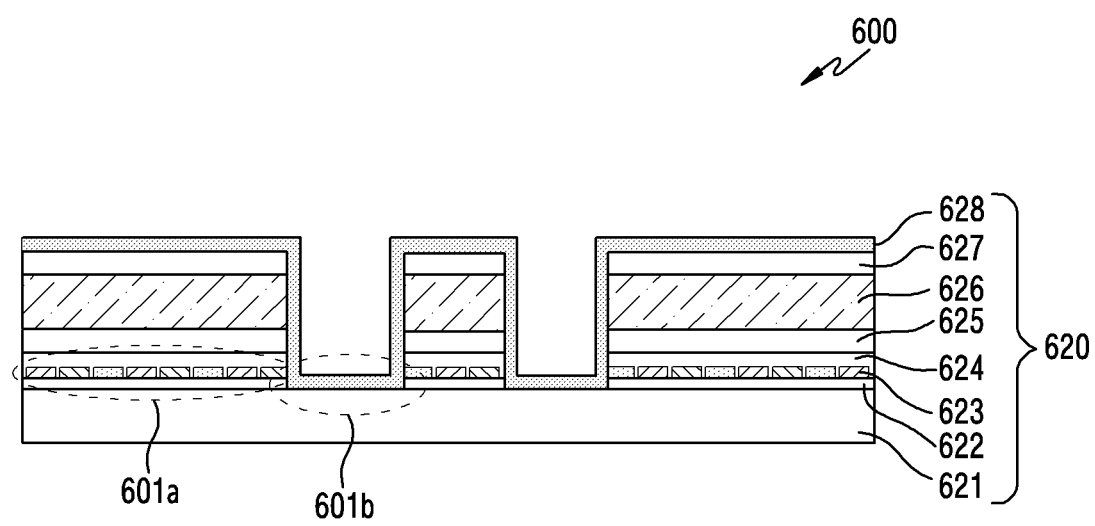
FIG. 8B is a view illustrating the manufacturing method of the electronic device, whereby a third inorganic layer is formed on the non-pixel area (or the transmission area) according to an embodiment of the disclosure.

FIG. 8B is a view illustrating a method for manufacturing the electronic device 600, whereby the third inorganic layer 628 is formed on the non-pixel area 601b (or transmission area) according to an embodiment of the disclosure.

Referring to FIGS. 6, 7A, 7B, and 8B, the third inorganic layer 628 may be formed on a front surface of the substrate 621. The third inorganic layer 628 may be formed to correspond to the whole surface of the under display camera area 601 and the display area 602. The third inorganic layer 628 may include the same material as the first inorganic layer 625 and may be formed by the same process.

The third inorganic layer 628 may be formed over the second inorganic layer 627 in the display area 602. The third inorganic layer 628 may be formed to cover an upper surface of the substrate 621 and an upper surface of the second inorganic layer 627 in the under display camera area 601. In addition, the third inorganic layer 628 may be formed to cover the sidewall surfaces of the pixel layer 623, the cathode 624, the first inorganic layer 625, the organic layer 626, and the second inorganic layer 627 which are exposed by the trench T1. The third inorganic layer 628 may prevent the organic layer 626 from being expanded, and may prevent moisture and oxygen from permeating the organic layer 626 and the pixel layer 623.

Figure 8C:
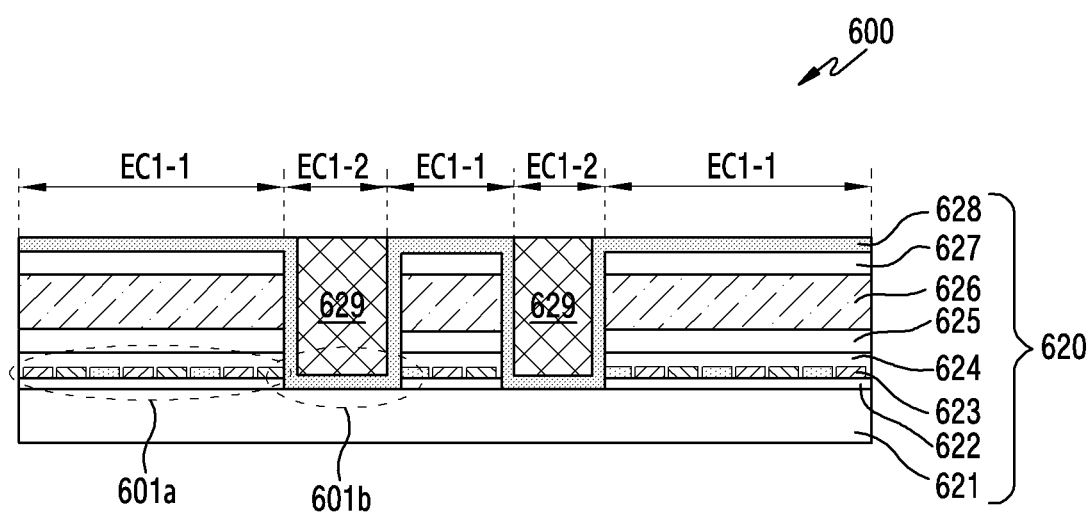
FIG. 8C is a view illustrating the manufacturing method of the electronic device, whereby an index matching portion is formed on the non-pixel area (or the transmission area) according to an embodiment of the disclosure.

FIG. 8C is a view illustrating a method for manufacturing the electronic device 600, whereby the index matching portion 629 is formed in the non-pixel area 601*b* (or transmission area) according to an embodiment of the disclosure.

Referring to FIGS. 6, 7A, 7B, and 8C, after the first inorganic layer 625, the organic layer 626, and the second inorganic layer 627 are removed from the under display camera area 601, the third inorganic layer 628 may be formed along the profile, and accordingly, a step may be formed. That is, there may be a step between the pixel area where the pixels 601*a* are formed and the non-pixel area 601*b* (or transmission area). The index matching portion 629 may be formed over the third inorganic layer 628 to fill the trench T1, and the step formed by removal of the first inorganic layer 625, the organic layer 626, and the second inorganic layer 627 may be compensated for.

Referring to FIGS. 7A, 7B, and 8C, the index matching portion 629 may be formed over the third inorganic layer 628 to fill the trench T1, such that the upper surface of the non-pixel area encapsulation portion EC1-2 is smoothened.

The upper surface of the first encapsulation portion E1 and the upper surface of the second encapsulation portion EC2 may be formed with the same height, thereby being smoothened. In an embodiment, the upper surface of the pixel area encapsulation portion EC1-1 and the upper surface of the second encapsulation portion EC2 may be formed with the same height, thereby being smoothened. In an embodiment, the upper surface of the non-pixel area encapsulation portion EC1-2 and the upper surface of the second encapsulation portion EC2 may be formed with the same height, thereby being smoothened.

The upper surface of the pixel area encapsulation portion EC1-1, the upper surface of the non-pixel area encapsulation portion EC1-2, and the upper surface of the second encapsulation portion EC2 may be smoothened, and the touch panel 630 (or touch pattern) may be smoothly formed on the encapsulation portion EC1, EC2. In addition, the drive circuit and the pixels may be removed from the non-pixel area 601*b* (or transmission area) and the index matching portion 629 may be formed, so that transmissivity of the under display camera area 601 may be enhanced.

Figure 9A:
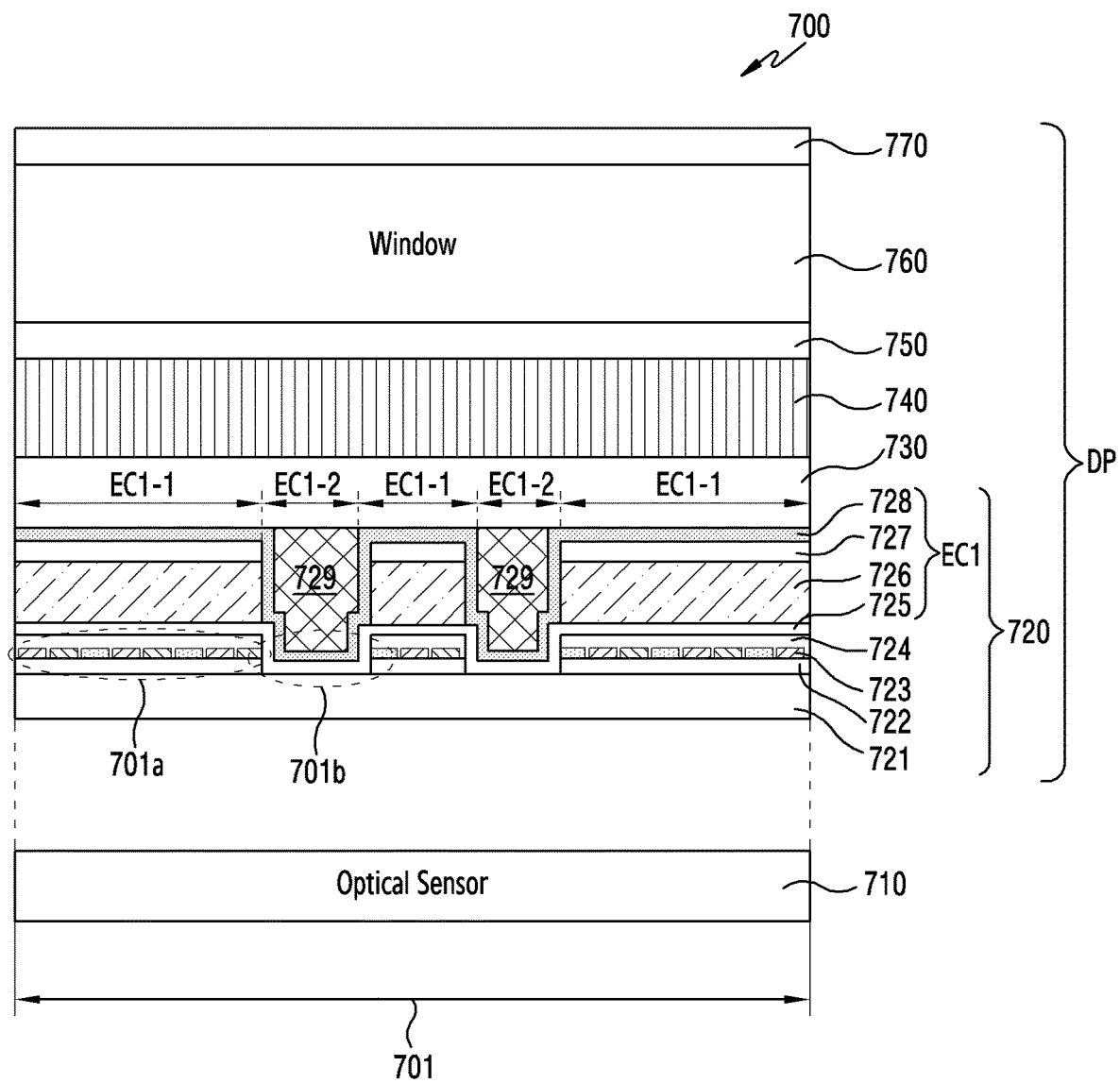
FIG. 9A is a view illustrating a cross section of an under display camera (UDC) area according to an embodiment of the disclosure.
Figure 9B:
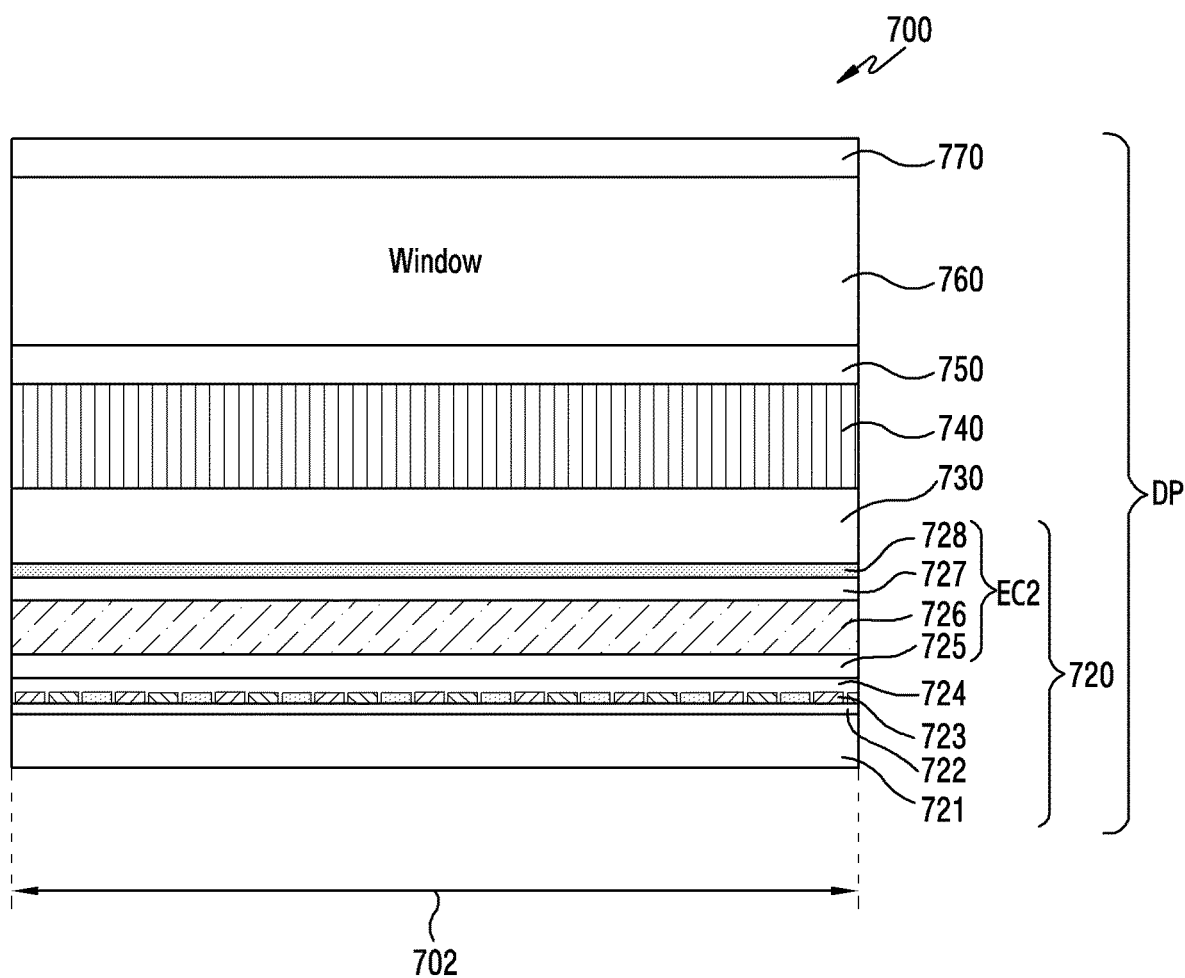
FIG. 9B is a view illustrating a cross section of a display area according to an embodiment of the disclosure.

FIG. 9A is a view illustrating a cross section of an under display camera (UDC) area 701 according to an embodiment of the disclosure. FIG. 9B is a view illustrating a cross section of a display area 702 according to an embodiment of the disclosure.

In explaining an electronic device 700 according to various embodiments of the disclosure with reference to FIGS. 9A and 9B, the same components as those of the electronic device 600 of FIGS. 6, 7A, and 7B will not be described.

Referring to FIGS. 9A and 9B, the electronic device 700 according to various embodiments of the disclosure may include a display (DP) (for example, the display 10 of FIG. 1 or the display device 1060 of FIG. 2) and an optical sensor 710. In an embodiment, as the optical sensor 710, an image sensor, a fingerprint sensor, the camera module 1080 of FIG. 2, the camera module 105 of FIG. 3A, or the camera module 1080 of FIG. 2 may be applied.

The display (DP) may include a display panel 720, a touch panel 730 (or touch pattern) (for example, the touch circuitry 50 of FIG. 1), a polarizing film 740, an adhesive member 750, a window 760 (for example, ultra-thin glass (UTG) or polymer), and a protection film 770.

An image may be displayed on the whole front surface (for example, a surface on which a screen is displayed) of the display (DP) except for a bezel. The front surface (for example, the surface on which the screen is displayed) of the display (DP) may include an under display camera area 701 and a display area (for example, the display area 602 of FIG. 6). In the disclosure, the under display camera area 701 may be a sensor area. The optical sensor 710 (for example, a camera module, an optical sensor, a fingerprint sensor, or an image sensor) may be disposed on a lower portion of the display (DP) to correspond to the under display camera area 701. The other portion of the front surface (for example, the surface on which the screen is displayed) of the display (DP) except for the under display camera area 701 corresponding to the optical sensor 710 may be the display area 702 (for example, the display area 602 of FIG. 6).

The optical sensor 710 may be disposed on a lower portion of the display panel 720 in an under display camera (UDC) method. First pixels (for example, the first pixels 601*a* of FIG. 6) may be disposed even in the under display camera area 701 in which the optical sensor 710 is disposed, thereby displaying an image.

Since the optical sensor 710 is disposed on the lower portion of the display panel 720 in the under display camera (UDC) method, there may be a need for guaranteeing transmissivity by considering quality of a photographed image. To achieve this, the number of first pixels (for example, the pixels 601*a* of FIG. 6) disposed in the under display camera area 701 may be smaller than the number of second pixels (for example, the pixels 602*a* of FIG. 6) disposed in the display area 702 (for example, the display area 602 of FIG. 6). The first pixels 701*a* may be disposed on a portion of the whole area of the under display camera area 701, and a non-pixel area 701*b* (or a clear area) without pixels may be disposed on the other portion.

The display panel 720 may include a substrate 721 (for example, a glass substrate or a polymer (for example, polyimide (PI)) substrate), a drive circuit layer 722 (for example, a TFT layer), a pixel layer 723, a cathode 724, and an encapsulation portion EC1, EC2.

The first and second encapsulation portions EC1, EC2 may be formed to correspond to the under display camera area 701 (for example, the under display camera area 601 of FIG. 6) and the display area 702 (for example, the display area 602 of FIG. 6). The first and second encapsulation portions EC1, EC2 may be formed in a layered structure of a plurality of inorganic layers 725, 727, 728 and one or more organic layers 726.

The first encapsulation portion EC1 may encapsulate the under display camera area 701. The second encapsulation portion EC2 may encapsulate the display area 702. The first encapsulation portion EC1 of the under display camera area 701 and the second encapsulation portion EC2 of the display area 702 may include different configurations.

The first encapsulation portion EC1 for encapsulating the under display camera area 701 may include a pixel area encapsulation portion EC1-1 for encapsulating a pixel area in which the pixels 701*a* are disposed, and a non-pixel area encapsulation portion EC1-2 for encapsulating the non-pixel area 701*b* (or the transmission area). The pixel area encapsulation portion EC1-1 and the non-pixel area encapsulation portion EC1-2 may be disposed in different forms. The pixel area encapsulation portion EC1-1 and the non-pixel area encapsulation portion EC1-2 may include different configurations. The pixel area encapsulation portion EC1-1 and the non-pixel area encapsulation portion EC1-2 may have different stacked structures of layers.

The pixel area encapsulation portion EC1-1 may include a first inorganic layer 725, an organic layer 726, a second inorganic layer 727, and a third inorganic layer 728. The pixel area encapsulation portion EC1-1 may include the same configuration as the second encapsulation portion EC2 for encapsulating the display area 702.

The organic layer 726 among the first inorganic layer 725, the second inorganic layer 727, the third inorganic layer 728, the organic layer 726 of the pixel area encapsulation portion EC1-1 and the second encapsulation portion EC2 may be thickest. The first inorganic layer 725, the second inorganic layer 727, and the third inorganic layer 728 of the pixel area encapsulation portion EC1-1 and the second encapsulation portion EC2 may be formed with the same thickness.

The first inorganic layer 725 of the pixel area encapsulation portion EC1-1 may be disposed over the cathode 724. The organic layer 726 of the pixel area encapsulation portion EC1-1 may be disposed over the first inorganic layer 725. The second inorganic layer 727 of the pixel area encapsulation portion EC1-1 may be disposed over the organic layer 726. The third inorganic layer 728 of the pixel area encapsulation portion EC1-1 may be disposed over the second inorganic layer 727.

The non-pixel area encapsulation portion EC1-2 may include the first inorganic layer 725, the third inorganic layer 728 and an index matching portion 629.

In order to guarantee transmissivity of the non-pixel area 701b (or transmission area), the organic layer 726 and the second inorganic layer 727 may be removed, and the third inorganic layer 628 may be formed along a profile from which the organic layer 726 and the second inorganic layer 727 are removed. When the organic layer 726 and the second inorganic layer 727 of the non-pixel area encapsulation portion EC1-2 are removed in a manufacturing process, a part of the first inorganic layer 725 may be removed and the height of the first inorganic layer 725 may be reduced, or the whole first inorganic layer 725 may be removed.

In an embodiment, when the first inorganic layer 725 of the non-pixel area encapsulation portion EC1-2 is not removed, a thickness of the first inorganic layer 725 of the non-pixel area encapsulation portion EC1-2 may be the same as a thickness of the first inorganic layer 725 of the pixel area encapsulation portion EC1-1.

In an embodiment, when a part of the first inorganic layer 725 of the non-pixel area encapsulation portion EC1-2 is removed, a thickness of the first inorganic layer 725 of the non-pixel area encapsulation portion EC1-2 may be thinner than the thickness of the first inorganic layer 725 of the pixel area encapsulation portion EC1-1.

The third inorganic layer 728 may be formed to cover sidewalls of the first inorganic layer 725, the organic layer 726, and the second inorganic layer 727, and to prevent expansion of the organic layer 726. Moisture and oxygen may be prevented from permeating the pixels and the organic layer 726 by the third inorganic layer 728.

A step generated by removal of the first inorganic layer 725, the organic layer 726, and the second inorganic layer 727 may be compensated for by the index matching portion 729. The index matching portion 729 may be formed over the third inorganic layer 728, such that the upper surface of the non-pixel area encapsulation portion EC1-2 is smoothened.

An upper surface of the first encapsulation portion EC1 and an upper surface of the second encapsulation portion EC2 may be formed with the same height, thereby being smoothened. In an embodiment, an upper surface of the pixel area encapsulation portion EC1-1 and the upper surface of the second encapsulation portion EC2 may be formed with the same height, thereby being smoothened. In an embodiment, an upper surface of the non-pixel area encapsulation portion EC1-2 and the upper surface of the second encapsulation portion EC2 may be formed with the same height, thereby being smoothened.

The second encapsulation portion EC2 for encapsulating the display area 702 may be formed on the front surface except for the under display camera area 701. The second encapsulation portion EC2 may include the first inorganic layer 725, the organic layer 726, the second inorganic layer 727, and the third inorganic layer 728. The first inorganic layer 725 may be formed over the cathode 724. The organic layer 726 may be formed over the first inorganic layer 725. The second inorganic layer 727 may be formed over the organic layer 726. The third inorganic layer 728 may be formed over the second inorganic layer 727.

Figure 10A:
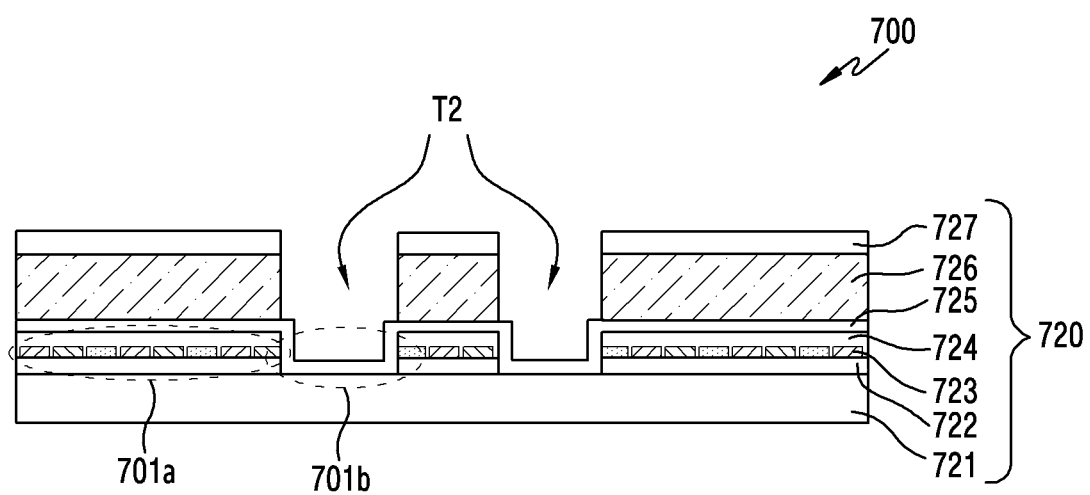
FIG. 10A is a view illustrating a manufacturing method of an electronic device, whereby a trench is formed in a non-pixel area (or a transmission area) according to an embodiment of the disclosure.

FIG. 10A is a view illustrating a method for manufacturing the electronic device 700, whereby a trench T2 is formed in the non-pixel area 701b (or transmission area) according to an embodiment of the disclosure.

Referring to FIGS. 9A, 9B, and 10A, the drive circuit layer 722 (for example, the TFT layer), the pixel layer 723, and the cathode 724 may be formed over the substrate 721 of the display area 702. The drive circuit layer 722 (for example, the TFT layer), the pixel layer 723, and the cathode 724 may not be formed in the under display camera area 701.

Next, in order to encapsulate pixels of the under display camera area 701 and the display area 702, the first inorganic layer 725, the organic layer 726, and the second inorganic layer 727 may be disposed over the cathode 724 in sequence.

In an embodiment, a monomer composition may be provided on an upper surface of the first inorganic layer 725, such that the organic layer 726 is smoothly formed on an upper portion of the first inorganic layer 725. The monomer composition may be provided on the upper surface of the first inorganic layer 725 by inkjet printing, screen printing, etc.

The second inorganic layer 727 may be formed over the organic layer 726. The second inorganic layer 727 may include the same material as the first inorganic layer 725 and may be formed by the same process.

Next, in order to guarantee transmissivity of the non-pixel area 701b (or transmission area) where a driver circuit and pixels are not formed in the under display camera area 701, the organic layer 726 and the second inorganic layer 727 may be removed, and a trench T2 may be formed. In this case, the first inorganic layer 725 may be left without being removed. The trench T2 may be formed to expose the upper surface of the first inorganic layer 725. Herein, according to a margin of an etching process for removing the organic layer 726 and the second inorganic layer 727, the whole first inorganic layer 725 may be left, or a part of the first inorganic layer 725 may be removed. When a part of the first inorganic layer 725 is removed, a thickness of the first inorganic layer 725 may be reduced. In this case, a thickness of the first inorganic layer 725 of the non-pixel area 701b (or transmission area) may be thinner than a thickness of the second inorganic layer 727 disposed on upper portions of the pixels 701a.

The first inorganic layer 725 may be disposed to cover sidewalls of the drive circuit layer 722 (for example, the TFT layer), the pixel layer 723, and the cathode 724. That is, the first inorganic layer 725 may be left such that sidewall surfaces of the drive circuit layer 722 (for example, the TFT layer), the pixel layer 723, and the cathode 724 are not exposed. Sidewall surfaces of the organic layer 726 and the second inorganic layer 727 may be exposed by the trench T2.

Figure 10B:
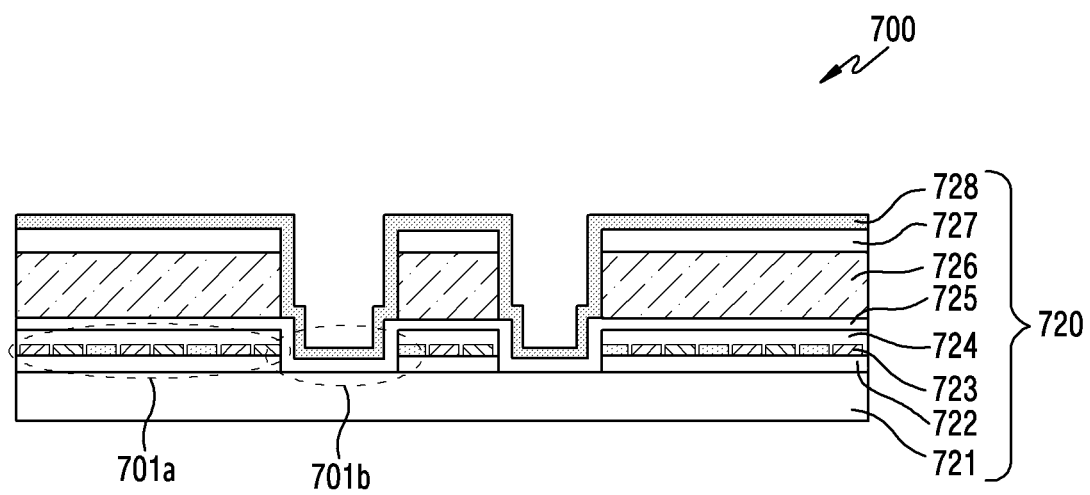
FIG. 10B is a view illustrating the manufacturing method of the electronic device, whereby a third inorganic layer is formed on the non-pixel area (or the transmission area) according to an embodiment of the disclosure.

FIG. 10B is a view illustrating a method for manufacturing the electronic device, whereby the third inorganic layer 728 is formed on the non-pixel area 701b (or transmission area) according to an embodiment of the disclosure.

Referring to FIGS. 9A, 9B, and 10B, the third inorganic layer 728 may be formed on a front surface of the substrate 721. The third inorganic layer 728 may be formed to correspond to the whole surface of the under display camera area 701 and the display area 702. The third inorganic layer 728 may include the same material as the first inorganic layer 725 and may be formed by the same process.

The third inorganic layer 728 may be formed over the second inorganic layer 727 in the display area 702. The third inorganic layer 728 may be formed to cover an upper surface of the first inorganic layer 725 and an upper surface of the second inorganic layer 727 in the under display camera area 701.

In an embodiment, the third inorganic layer 728 may be formed to cover the upper surface of the second inorganic layer 727 in a portion where the pixels 701a are formed in the under display camera area 701.

In an embodiment, the third inorganic layer 728 may be formed to cover the upper surface of the first inorganic layer 725 in the non-pixel area 701b (or the transmission area) of the under display camera area 701. In addition, the third inorganic layer 728 may be formed to cover sidewall surfaces of the organic layer 726 and the second inorganic layer 727 which are exposed by the trench T2.

The third inorganic layer 728 may prevent the organic layer 726 from being expanded, and may prevent moisture and oxygen from permeating the organic layer 726 and the pixel layer 723.

Figure 10C:
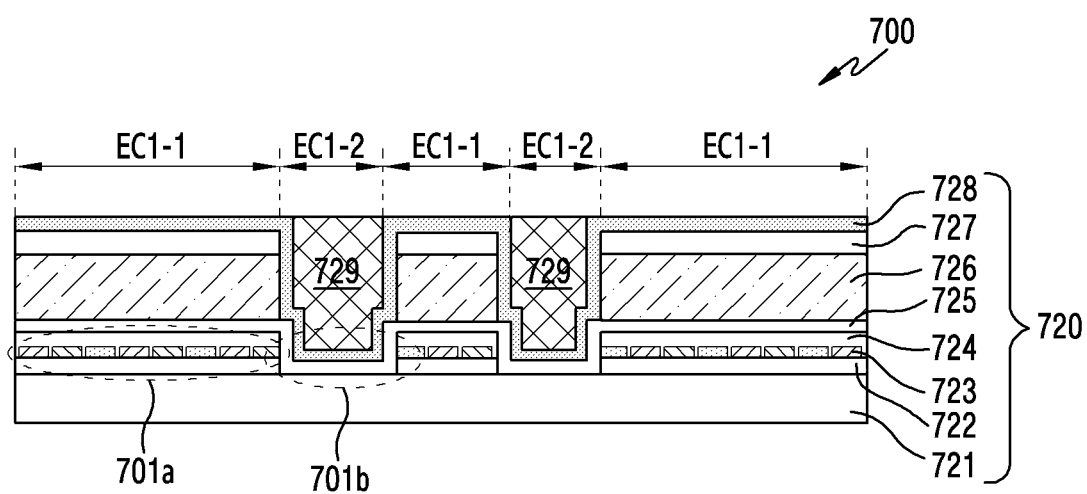
FIG. 10C is a view illustrating the manufacturing method of the electronic device, whereby an index matching portion is formed on the non-pixel area (or the transmission area) according to an embodiment of the disclosure.

FIG. 10C is a view illustrating a method for manufacturing the electronic device, whereby the index matching portion 729 is formed in the non-pixel area 701b (or transmission area) according to an embodiment of the disclosure.

Referring to FIGS. 9A, 9B, and 10C, after the organic layer 726 and the second inorganic layer 727 are removed from the under display camera area 701, the third inorganic layer 728 may be formed along the profile, and accordingly, a step may be formed. That is, there may be a step between the pixel area where the pixels 701a are formed and the non-pixel area 701b (or transmission area). The index matching portion 729 may be formed over the third inorganic layer 728 to fill the trench T2, and the step formed by removal of the organic layer 726 and the second inorganic layer 727 may be compensated for.

The index matching portion 729 may be formed over the third inorganic layer 728 to fill the trench T2, such that the upper surface of the non-pixel area encapsulation portion EC1-2 is smoothened. An upper surface of the second encapsulation portion EC2, an upper surface of the pixel area encapsulation portion EC1-1 and the upper surface of the non-pixel area encapsulation portion EC1-2 may be formed with the same height, thereby being smoothened.

The upper surface of the pixel area encapsulation portion EC1-1, the upper surface of the non-pixel area encapsulation portion EC1-2, and the upper surface of the second encapsulation portion EC2 may be smoothened, and the touch panel 730 (or touch pattern) may be smoothly formed on the encapsulation portion EC1, EC2. In addition, the drive circuit and the pixels may be removed from the non-pixel area 701b (or transmission area) and the index matching portion 729 may be formed, so that transmissivity of the under display camera area 701 may be enhanced.

In another embodiment, the second inorganic layer 727 and the third inorganic layer 728 may be formed on a front surface of the substrate 721. The second inorganic layer 727 and the third inorganic layer 728 may be formed to correspond to the whole surface of the under display camera area 701 and the display area 702. The second inorganic layer 727 and the third inorganic layer 728 may include the same material as the first inorganic layer 725 and may be formed by the same process.

The second inorganic layer 727 may be formed over the first inorganic layer 725 in the display area 702. The second inorganic layer 727 may be formed to cover an upper surface of the first inorganic layer 725 in the under display camera area 701.

In an embodiment, the second inorganic layer 727 may be formed to cover the upper surface of the first inorganic layer 725 in a portion where the pixels 701a are formed in the under display camera area 701.

In an embodiment, the second inorganic layer 727 may be formed to cover the upper surface of the substrate 721 in the non-pixel area 701b (or the transmission area) of the under display camera area 701. In addition, the second inorganic layer 727 may be formed to cover sidewall surfaces of the organic layer 726 and the first inorganic layer 725 which are exposed by the trench T2.

The second inorganic layer 727 may prevent the organic layer 726 from being expanded, and may prevent moisture and oxygen from permeating the organic layer 726 and the pixel layer 723.

In an embodiment, after the first inorganic layer 725 and the organic layer 726 are removed from the under display camera area 701, the second inorganic layer 727 may be formed along the profile, and accordingly, a step may be formed. That is, there may be a step between the pixel area where the pixels 701a are formed and the non-pixel area 701b (or transmission area). The index matching portion 729 may be formed over the second inorganic layer 727 to fill the trench T2, and the step formed by removal of the first inorganic layer 725 and the organic layer 726 may be compensated for.

The index matching portion 729 may be formed over the second inorganic layer 727 to fill the trench T2, such that the upper surface of the non-pixel area encapsulation portion EC1-2 is smoothened. An upper surface of the second encapsulation portion EC2, an upper surface of the pixel area encapsulation portion EC1-1 and the upper surface of the non-pixel area encapsulation portion EC1-2 may be formed with the same height, thereby being smoothened.

The third inorganic layer 728 may be formed to cover the upper surface of the pixel area encapsulation portion EC1-1 and the upper surface of the non-pixel area encapsulation portion EC1-2 which are smoothened.

An electronic device 600 according to various embodiments of the disclosure may include a display panel 620 and one or more optical sensors 610. The display panel 620 may be disposed in an inner space of a housing 110 or 500 to be visible from the outside, and may include a display area 602 and a sensor area 601. The one or more optical sensors 610 may correspond to the sensor area 601 under the display panel 620. The display panel 620 may include a plurality of pixels 601a, 602a disposed over a substrate 621, a plurality of drive circuits for driving the plurality of pixels 601a, 602a, a first encapsulation portion EC1 for encapsulating the sensor area 601, and a second encapsulation portion EC2 for encapsulating the display area. The first encapsulation portion EC1 and the second encapsulation portion EC2 may have different stacked structures of layers.

The sensor area 601 of the electronic device 600 may include a pixel area where the plurality of first pixels 601*a* are disposed, and a non-pixel area 601*b* where pixels are not disposed. The first encapsulation portion EC1 may include a pixel area encapsulation portion EC1-1 for encapsulating the pixel area, and a non-pixel area encapsulation portion EC1-2 for encapsulating the non-pixel area.

The pixel area encapsulation portion EC1-1 of the electronic device 600 may include an organic layer 626, and the non-pixel area encapsulation portion may not include the organic layer 626.

The pixel area encapsulation portion EC1-1 of the electronic device 600 may include at least two layers of a first inorganic layer 625, the organic layer 626 over the first inorganic layer 625, a second inorganic layer 627 over the organic layer 626, and a third inorganic layer 628 over the second inorganic layer 627.

The non-pixel area encapsulation portion EC1-2 of the electronic device 600 may include the third inorganic layer 628 and an index matching portion 629 over the third inorganic layer 628.

The non-pixel area encapsulation portion EC1-2 of the electronic device 600 may include the first inorganic layer 625, the third inorganic layer 628 over the first inorganic layer 625, and the index matching portion 629 over the third inorganic layer 628.

In the electronic device 600, an upper surface of the pixel area encapsulation area EC1-1 and an upper surface of the non-pixel area encapsulation portion EC1-2 may be formed with the same height.

In the electronic device 600, an upper surface of the first encapsulation portion EC1 and an upper surface of the second encapsulation portion EC2 may be formed with the same height.

The second encapsulation portion EC2 of the electronic device 600 may include the first inorganic layer 625, the organic layer 626 over the first inorganic layer 625, the second inorganic layer 627 over the organic layer 626, and the third inorganic layer 628 over the second inorganic layer 627.

The electronic device 600 may include a touch panel 630, a polarizing film 640, and/or a window 660 disposed on the display panel 620.

An electronic device 600 according to various embodiments of the disclosure may include a display panel 620 and one or more optical sensors 610. The display panel 620 may be disposed in an inner space of a housing 110 or 500 to be visible from the outside, and may include a display area 602 and a sensor area 601. The one or more optical sensors 610 may correspond to the sensor area 601 under the display panel 620. The display panel 620 may include a plurality of pixels 601*a*, 602*a* disposed over a substrate 621, a plurality of drive circuits for driving the plurality of pixels 601*a*, 602*a*, a first encapsulation portion EC1 for encapsulating the sensor area 601, and a second encapsulation portion EC2 for encapsulating the display area. A first portion EC1-1 of the first encapsulation portion EC1 may encapsulate a pixel area where the first pixels 601*a* are formed. A second portion EC1-2 of the first encapsulation portion EC1 may encapsulate a transmission area 601*b* where the pixels 601*a* are not formed.

The first portion EC1-1 of the first encapsulation portion EC1 of the electronic device 600 may have the same stacked structure of layers as the second encapsulation portion EC2. The second portion EC1-2 of the first encapsulation portion EC1 may have a different layered structure of layers from that of the second encapsulation portion EC2.

The first portion EC1-1 of the first encapsulation portion EC1 of the electronic device 600 may include an organic layer 626, and the second portion EC1-2 of the first encapsulation portion EC1 may not include the organic layer 626.

The first portion EC-1 of the first encapsulation portion EC1 of the electronic device 600 may include a first inorganic layer 625, the organic layer 626 over the first inorganic layer 625, a second inorganic layer 627 over the organic layer 626, a third inorganic layer 628 over the second inorganic layer 627.

The second portion EC1-2 of the first encapsulation portion EC1 of the electronic device 600 may include the third inorganic layer 628 and an index matching portion 629 over the third inorganic layer 628.

The second portion EC1-2 of the first encapsulation portion EC1 of the electronic device 600 may include the first inorganic layer 625, the third inorganic layer 628 over the first inorganic layer 625, and the index matching portion 629 over the third inorganic layer 628.

An upper surface of the first portion EC1-1 of the first encapsulation portion EC1 of the electronic device 600, and an upper surface of the second portion EC1-2 of the first encapsulation portion EC1 may be formed with the same height.

An upper surface of the first encapsulation portion EC1 of the electronic device 600, and an upper surface of the second encapsulation portion EC2 may be formed with the same height.

The second encapsulation portion EC2 of the electronic device 600 may include the first inorganic layer 625, the organic layer 626 over the first inorganic layer 625, the second inorganic layer 627 over the organic layer 626, and the third inorganic layer 628 over the second inorganic layer 627.

The electronic device 600 may include a touch panel 630, a polarizing film 640, and a window 660 disposed on the display panel 620.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 1040) including one or more instructions that are stored in a storage medium (e.g., internal memory 1036 or external memory 1038) that is readable by a machine (e.g., the electronic device 1001). For example, a processor (e.g., the processor 1020) of the machine (e.g., the electronic device 1001) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a display panel disposed in an inner space of a housing to be visible from an outside, the display panel comprising:
   a display area,
   a sensor area, wherein the sensor area comprises a pixel area in which a plurality of first pixels are disposed and a non-pixel area in which pixels are not disposed,
   a plurality of pixels disposed over a substrate,
   a plurality of drive circuits configured to drive the plurality of pixels,
   a first encapsulation portion configured to encapsulate the sensor area, wherein the first encapsulation portion comprises a pixel area encapsulation portion configured to encapsulate the pixel area and a non-pixel area encapsulation portion configured to encapsulate a non-pixel area, an organic layer on the first inorganic layer, and a third inorganic layer surrounding a portion of the organic layer, wherein the pixel area encapsulation portion comprises a first inorganic layer disposed to cover a pixel layer and a cathode, wherein the non-pixel area encapsulation portion comprises the first inorganic layer, the third inorganic layer disposed over the first inorganic layer to form a sidewall, and a transmissivity enhancing portion disposed within the sidewall formed by the third inorganic layer, and
   a second encapsulation portion configured to encapsulate the display area; and
   one or more optical sensors which correspond to the sensor area under the display panel,
   wherein the first encapsulation portion and the second encapsulation portion have different stacked structures of layers.

2. The electronic device of claim 1, wherein the pixel area encapsulation portion comprises an organic layer, and the non-pixel area encapsulation portion does not comprise an organic layer.

3. The electronic device of claim 1, wherein the pixel area encapsulation portion comprises at least two layers of a first inorganic layer, an organic layer over the first inorganic layer, a second inorganic layer over the organic layer, and a third inorganic layer over the second inorganic layer.

4. The electronic device of claim 3, wherein the non-pixel area encapsulation portion comprises the third inorganic layer and an index matching portion over the third inorganic layer.

5. The electronic device of claim 1, wherein an upper surface of the pixel area encapsulation portion and an upper surface of the non-pixel area encapsulation portion are formed with a same height.

6. The electronic device of claim 1, wherein an upper surface of the first encapsulation portion and an upper surface of the second encapsulation portion are formed with a same height.

7. The electronic device of claim 1, wherein the second encapsulation portion comprises a first inorganic layer, an organic layer over the first inorganic layer, a second inorganic layer over the organic layer, and a third inorganic layer over the second inorganic layer.

8. The electronic device of claim 1, further comprising at least one of:
   a touch panel;
   a polarizing film; or
   a window disposed on the display panel.

9. The electronic device of claim 1, wherein the first encapsulation portion and the second encapsulation portion do not overlap.

\* \* \* \* \*